United States Patent
Sasaki et al.

(10) Patent No.: US 10,175,728 B2
(45) Date of Patent: Jan. 8, 2019

(54) LAMINATE AND INTEGRALLY MOLDED ARTICLE

(71) Applicant: TORAY INDUSTRIES, INC., Tokyo (JP)

(72) Inventors: Hideaki Sasaki, Nagoya (JP); Hideki Nudeshima, Nagoya (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/320,420

(22) PCT Filed: Jun. 11, 2015

(86) PCT No.: PCT/JP2015/066803
§ 371 (c)(1),
(2) Date: Dec. 20, 2016

(87) PCT Pub. No.: WO2016/002456
PCT Pub. Date: Jan. 7, 2016

(65) Prior Publication Data
US 2017/0185108 A1    Jun. 29, 2017

(30) Foreign Application Priority Data

Jun. 30, 2014 (JP) .................................. 2014-134150

(51) Int. Cl.
*B32B 7/02* (2006.01)
*G06F 1/16* (2006.01)
(Continued)

(52) U.S. Cl.
CPC .............. *G06F 1/1656* (2013.01); *B32B 5/02* (2013.01); *B32B 5/12* (2013.01); *B32B 5/26* (2013.01);
(Continued)

(58) Field of Classification Search
CPC .... G06F 1/1656; H01Q 1/526; H01Q 1/2266; H05K 9/0045; H05K 9/0047;
(Continued)

(56) References Cited

U.S. PATENT DOCUMENTS

| | | | |
|---|---|---|---|
| 8,092,897 B2 * | 1/2012 | Honma | B32B 5/10 428/142 |
| 2015/0200442 A1 * | 7/2015 | Aurongzeb | H01Q 1/2266 343/702 |
| 2015/0289425 A1 | 10/2015 | Yoshida | |

FOREIGN PATENT DOCUMENTS

| | | |
|---|---|---|
| JP | 0690069 | 3/1994 |
| JP | 2000184316 | 6/2000 |

(Continued)

OTHER PUBLICATIONS

2013 ASHRAE Handbook, Table 33.3.*

(Continued)

*Primary Examiner* — Maria V Ewald
*Assistant Examiner* — Zachary M Davis
(74) *Attorney, Agent, or Firm* — RatnerPrestia

(57) ABSTRACT

A laminate including a radio wave permeable member having a radio wave permeability; and a heat conducting member having an electromagnetic wave shielding property and/or a rigidity retaining member having an electromagnetic wave shielding property in the thickness direction of the radio wave permeable member; wherein the laminate has a radio wave permeable area solely constituted from the radio wave permeable member as a part of the laminate, and the radio wave permeable area is a thin area; and an integrally molded article using such laminate.

13 Claims, 24 Drawing Sheets

(51) Int. Cl.
*H01Q 17/00* (2006.01)
*H01Q 1/52* (2006.01)
*B32B 5/02* (2006.01)
*B32B 5/12* (2006.01)
*B32B 5/26* (2006.01)
*B32B 7/12* (2006.01)
*B32B 15/085* (2006.01)
*B32B 15/14* (2006.01)
*B32B 15/18* (2006.01)
*B32B 15/20* (2006.01)
*B32B 27/32* (2006.01)
*G06F 1/20* (2006.01)
*H04B 1/3827* (2015.01)
*H05K 9/00* (2006.01)

(52) U.S. Cl.
CPC ............... *B32B 7/02* (2013.01); *B32B 7/12* (2013.01); *B32B 15/085* (2013.01); *B32B 15/14* (2013.01); *B32B 15/18* (2013.01); *B32B 15/20* (2013.01); *B32B 27/32* (2013.01); *G06F 1/20* (2013.01); *H01Q 1/526* (2013.01); *H01Q 17/00* (2013.01); *H04B 1/3838* (2013.01); *H05K 9/009* (2013.01); *B32B 2250/44* (2013.01); *B32B 2260/023* (2013.01); *B32B 2260/046* (2013.01); *B32B 2262/0246* (2013.01); *B32B 2262/0253* (2013.01); *B32B 2262/0261* (2013.01); *B32B 2262/0269* (2013.01); *B32B 2262/0276* (2013.01); *B32B 2262/101* (2013.01); *B32B 2262/103* (2013.01); *B32B 2262/105* (2013.01); *B32B 2262/106* (2013.01); *B32B 2307/212* (2013.01); *B32B 2307/302* (2013.01); *B32B 2307/546* (2013.01); *B32B 2307/70* (2013.01); *B32B 2457/00* (2013.01)

(58) Field of Classification Search
CPC ...... H05K 1/0225; H05K 1/0227; H05K 9/00; H05K 9/0003; H05K 9/0007; H05K 9/002; H05K 9/0022; H05K 9/0024; H05K 9/0073; H05K 9/0081; H05K 9/009; B32B 5/12; B32B 27/12; B32B 15/04; B32B 15/14; B32B 15/092; B32B 2262/105; B32B 2262/106; B32B 3/266; Y10T 428/12361; Y10T 428/12396; Y10T 428/20; Y10T 428/24851
USPC ........................................................ 428/131
See application file for complete search history.

(56) References Cited

FOREIGN PATENT DOCUMENTS

| | | |
|---|---|---|
| JP | 2008034823 | 2/2008 |
| JP | 2008177275 | 7/2008 |
| JP | 2010253937 | 11/2010 |
| JP | 2011093213 | 5/2011 |
| JP | 2013075447 | 4/2013 |
| JP | 2013086469 | 5/2013 |
| JP | 2014060237 | 4/2014 |
| WO | 2014065261 | 5/2014 |

OTHER PUBLICATIONS

Website: http://gwcomposites.com:80/carbonvsfiberglass/ Published Apr. 9, 2013, Accessed Jul. 21, 2017.*
International Search Report and Written Opinion for International Application No. PCT/JP2015/066803, dated Sep. 8, 2015, 6 pages.

* cited by examiner

LAMINATE AND INTEGRALLY MOLDED ARTICLE

CROSS REFERENCE TO RELATED APPLICATIONS

This is the U.S. National Phase application of PCT International Application No. PCT/JP2015/066803, filed Jun. 11, 2015, and claims priority to Japanese Patent Application No. 2014-134150, filed Jun. 30, 2014, the disclosures of each of these applications being incorporated herein by reference in their entireties for all purposes.

FIELD OF THE INVENTION

This invention relates to a laminate formed from a fiber reinforced plastic or the like which is used as a part or casing of personal computer, OA equipment, mobile phone, and the like. This invention also relates to an integrally molded article.

BACKGROUND OF THE INVENTION

Reduction in size and weight is required for electric and electronic equipment such as personal computer, OA equipment, AV equipment, mobile phone, phone, facsimile, home appliance, and toys with the spread of mobile equipment. In addition to such requirements, the part constituting the equipment, and in particular, casing is required to satisfy the requirements of higher strength, higher rigidity, and thinner wall so that the casing is not largely deformed to become in contact with and induce breakage of the parts accommodated in the casing when a load is applied from its exterior.

Another property required for the casing of electronic equipment is the performance of suppressing electromagnetic interference (EMI) by shielding the radio wave, namely, the radio wave shielding performance. This property is required for preventing the effects on the operation of other equipment and human body by the radio wave emitted from the equipment during its operation. The electromagnetic wave emitted from the electronic equipment itself may adversely affect the operation of other equipment.

In addition, many of the notebook personal computers, mobile phones, and tablet products are equipped with an antenna for wireless communication, and inmost cases, such antenna is accommodated in the interior of the casing considering the portability and design convenience. When a material having a high electromagnetic wave shielding property, for example, a carbon fiber reinforced plastic or a metal such as magnesium alloy is selected for the material constituting the entire surface of the casing of such equipment, the casing having a high radio wave shielding performance invites functional problem of deteriorated radio communication performance due to decrease in average antenna gain, biased radio wave directivity, and the like.

In addition, in the case of products accommodating radio communication function having increased functionality in its interior, the product is required to have a reduced size, and the heat generated from the parts accommodated in the interior has considerable effects and dissipation of the heat is an important task.

Patent Document 1 discloses the technology of improving strength of the junction part and mass productivity while retaining the radio wave shielding property without detracting from the radio communication performance by integrating a casing for electronic equipment having a radio wave shielding material comprising a fiber-reinforced resin and a radio wave permeating member comprising fiber reinforced thermoplastic resin comprising a thermoplastic resin having a certain amount of non-conductive reinforcing fiber added thereto by a method wherein thermoplastic resin adhesion layer is placed in the adhesion interface between the radio wave shielding material and the radio wave permeating member so the thermoplastic resin adhesion layer will be present on the adhesion interface of the radio wave shielding material and the radio wave permeating member by means of outsert injection molding.

However, in the technology disclosed in Patent Document 1, thickness of the radio wave shielding member that is set first does not change before and after the molding, and adjustment to match the thickness of the 2 materials, namely, the radio wave shielding member and the radio wave permeating member in the molding is difficult. Accordingly, a step is generated along the junction of the resulting molded article, and for example, a line of junction is visually recognizable even after the coating of the molded article adversely affecting the design property of the article. In addition, in the Patent Document 1, the radio wave permeating member used in the radio wave permeable area for realizing the radio communication performance is an insulating material, and since an insulating material generally suffer from the high press shrinkage, provision of a large radio wave permeable area may invite the problem of warping and deformation of the casing after the injection molding due to the difference in the molding shrinkage.

Patent Document 2 discloses the technology of particularly improving design property while retaining the radio wave shielding property without detracting from the radio communication performance by forming a molded article of a fiber reinforced plastic by preparing a sheet-shape molding precursor comprising a molding material substrate (A) containing a conductive fiber as the reinforcing fiber and a thermoplastic resin as the matrix and a molding material substrate (B) containing an insulating fiber as the reinforcing fiber and a thermoplastic resin as the matrix, wherein the molding material substrate (B) is inserted through the molding material substrate (A) in the thickness direction to forma sheet-shape molding precursor; heating the molding precursor to a temperature higher than the melting temperature of the thermoplastic resin; and thereafter conducting the press molding at a temperature lower than the melting temperature of the thermoplastic resin to form a molded article of the fiber reinforced plastic.

However, the technology disclosed in Patent Document 2 require preliminary cutting of the part where the radio wave permeable area is to be formed in the molding material substrate (A), and also, preliminary preparation of the molding material substrate (B) which should have a shape in precise size conformity with the cut portion in the molding material substrate (A). Accordingly, despite the capability of producing the casing having the radio wave permeable area by partial use of the insulating substrate, the production process is complicated with the unsolved problem of the production cost.

Patent Document 3 discloses the technology of producing a composite laminate plate having an improved design property with partial radio wave permeable area while retaining the electromagnetic wave shielding property without detracting from the radio communication performance by forming a pre-molding laminate of two or more composite substrates each prepared by abutting and joining a first reinforcing substrate which is a sheet paper having conductive discontinuous reinforcing fibers and a second substrate which is different from the first substrate wherein a matrix resin sheet containing a thermoplastic resin as its main component is disposed at least in some parts between the layers of the substrate laminate; placing the pre-molding laminate in a pair of mold; thermally melting the pre-molding laminate by applying pressure to the mold by a pressing machine to impregnate the matrix resin which had been in sheet form into the pre-molding laminate; and then cooling and shaping the laminate in the mold for integral molding.

However, in the technology disclosed in Patent Document 3, while retention of the electromagnetic wave shielding property without sacrificing the radio communication performance is enabled by abutting and joining an electromagnetic wave shielding member having a high radio wave shielding performance and a radio wave permeable member having a low radio wave shielding performance, there is yet room for improvement in the strength of the abutting joint between the electromagnetic wave shielding member and the radio wave permeable member, and there is also yet room for improvement in the flexibility for enabling diversification of the product since the shape of the electromagnetic wave shielding member and the radio wave permeable member had to be changed depending on the position of the radio wave generator member in the electronic equipment casing.

PATENT DOCUMENTS

Patent Document 1: Japanese Unexamined Patent Publication (Kokai) No. 2008-34823
Patent Document 2: Japanese Unexamined Patent Publication (Kokai) No. 2011-93213
Patent Document 3: Japanese Unexamined Patent Publication (Kokai) No. 2013-75447

SUMMARY OF THE INVENTION

In view of the problems of the prior art as described above, an object of the present invention is to provide a laminate which has maintained the radio wave shielding property without sacrificing the radio communication performance and which also exhibits good design property with reduced appearance of the line of junction, good thermal conductivity, reduced thickness, and high rigidity. Another object of the invention is to provide an integrally molded article thereof.

In order to solve the problems as described above, the laminate of an aspect of the present invention has the following constitution. Accordingly, the laminate comprises a radio wave permeable member having a radio wave permeability; and a heat conducting member having an electromagnetic wave shielding property and/or a rigidity retaining member having an electromagnetic wave shielding property in the thickness direction of the radio wave permeable member; and the laminate has a radio wave permeable area solely constituted from the radio wave permeable member as a part of the laminate; and the radio wave permeable area is a thin area.

In order to solve the problems as described above, the integrally molded article of the present invention has the constitution as described below. More specifically, the integrally molded article is the one prepared by integrating the laminate as described above with one or more different members.

The present invention provides a laminate which has maintained the radio wave shielding property without sacrificing the radio communication performance and which has good design property with reduced appearance of the line of junction, good thermal conductivity, reduced thickness, and high rigidity as well as an integrally molded article thereof. When the laminate and the integrally molded article of the present invention are constituted mainly from a fiber reinforced plastic, the products will have a light weight, high strength, and high rigidity, and such products will be well adapted for use in the parts and casings of a personal computer, OA equipment, and mobile phone.

DETAILED DESCRIPTION OF EMBODIMENTS OF THE INVENTION

Figure 1A:
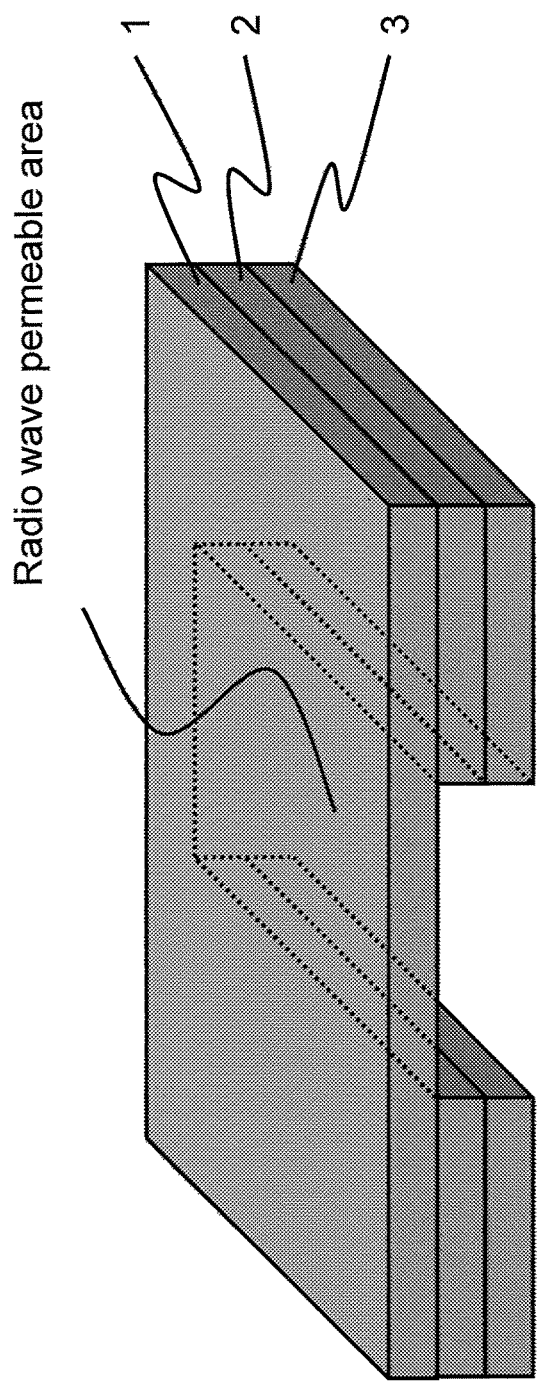
FIG. 1a is a partial transparent perspective view showing an embodiment of the laminate of the present invention.

Next, aspects of the present invention are described in detail by referring to the drawings, which by no means limit the scope of the present invention.

The laminate of an aspect of the present invention is a laminate prepared by laminating a radio wave permeable member having a radio wave permeability; and a heat conducting member having an electromagnetic wave shielding property and/or a rigidity retaining member having an electromagnetic wave shielding property in the thickness direction of the radio wave permeable member. In the following description, the radio wave permeable member having a radio wave permeability may be simply referred to as the radio wave permeable member, the heat conducting member having an electromagnetic wave shielding property in the thickness direction of the radio wave permeable member may be simply referred to as the heat conducting member; and the rigidity retaining member having an electromagnetic wave shielding property in the thickness direction of the radio wave permeable member may be simply referred to as the rigidity retaining member.

The laminate of an aspect of the present invention contains the radio wave permeable member as its critical component, and it also contains at least one of the heat conducting member and the rigidity retaining member. Accordingly, the resulting laminate exhibits electromagnetic wave shielding property.

The laminate of the present invention should also have a radio wave permeable area solely comprising the radio wave permeable member as a part of the laminate, and this radio wave permeable area should be a thin area. The radio wave permeable area is constituted solely from the radio wave permeable member. Due to the provision of such radio wave permeable area as a part of the laminate surface, the laminate is reliably provided with the area where the radio wave is permeable. Since the radio wave permeable area is provided only in the limited area requiring the radio wave permeability, the area other than the radio wave permeable area will retain the electromagnetic wave shielding function. Because of such constitution of the laminate of an aspect of the present invention as described above, both functions of the radio wave permeability and the electromagnetic wave shielding property are simultaneously provided within the laminate surface.

FIG. 1a is a partial transparent perspective view showing an embodiment of the laminate of the present invention. The laminate comprises a radio wave permeable member 1, a heat conducting member 2, and a rigidity retaining member 3, and it has a radio wave permeable area as a part thereof. The radio wave permeable area is solely constituted from the radio wave permeable member 1 without including either one of the heat conducting member 2 and the rigidity retaining member 3. The area other than the radio wave permeable area has the area comprising a laminate of the radio wave permeable member, the heat conducting member, and the rigidity retaining member, and such area constitutes the electromagnetic wave shielding area since such area includes both the heat conducting member and the rigidity retaining member having the electromagnetic wave shielding property in the thickness direction. As described above, a radio wave permeable area is formed by excluding the member having the electromagnetic wave shielding property in the thickness direction, and an electromagnetic wave shielding area is formed by including the member having the electromagnetic wave shielding property in the thickness direction.

Figure 1B:
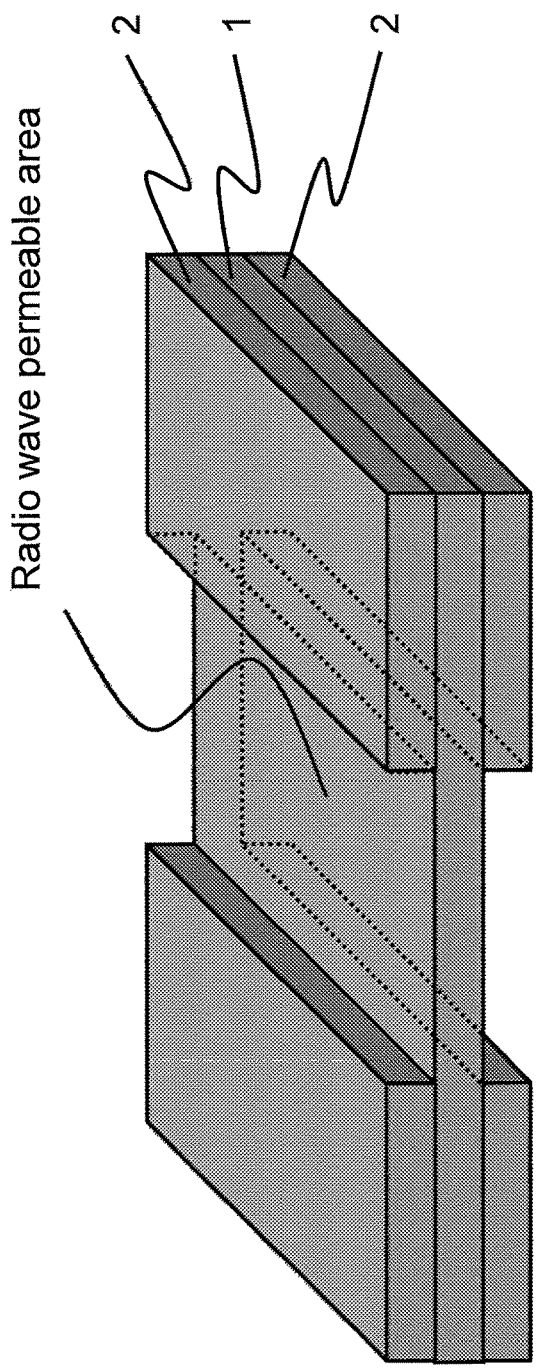
FIG. 1b is a partial transparent perspective view showing another embodiment of the laminate of the present invention.

In an aspect of the present invention, it is important that the radio wave permeable area is a thin area. The radio wave permeable area is referred to as the "thin area" when the radio wave permeable area is the area solely comprising the radio wave permeable member 1 in the thickness direction of the laminate as shown in FIG. 1a and FIG. 1b, and thickness of the radio wave permeable member 1 in the area is the same or less than the thickness of the radio wave permeable member 1 in the vicinity of the area. It is to be noted that, the thin area is typically constituted as an area not including at least one member constituting the laminate and as an area having a thickness less than the area including all members constituting the laminate in the thickness direction. It is also to be noted that, in the following description, the area including all members constituting the laminate in the thickness direction may be referred to as the "area including all members". The thin area in the radio wave permeable area preferably has a thickness the same as the thickness of the radio wave permeable member 1 in the vicinity of the area. When the radio wave permeable area is the thin area, a name plate (for example, a name plate with the logo depicted thereon) made from a material not inhibiting the radio wave permeability can be mounted on the side of the design surface as will be described later, and parts such as an antenna may be mounted on the side of the interior surface opposite to the design surface, and as a consequence, the entire thickness including the laminate after the mounting of such parts will be effectively reduced. As shown in FIG. 1b, when the rigidity retaining member 2 is disposed on left and right side of the radio wave permeable member 1 provided substantially at the center, the laminate will have a stepped surface, and the radio wave permeable area will constitute the thin area in relation to the area where the rigidity retaining member/the radio wave permeable member/the rigidity retaining member are laminated.

Figure 2:
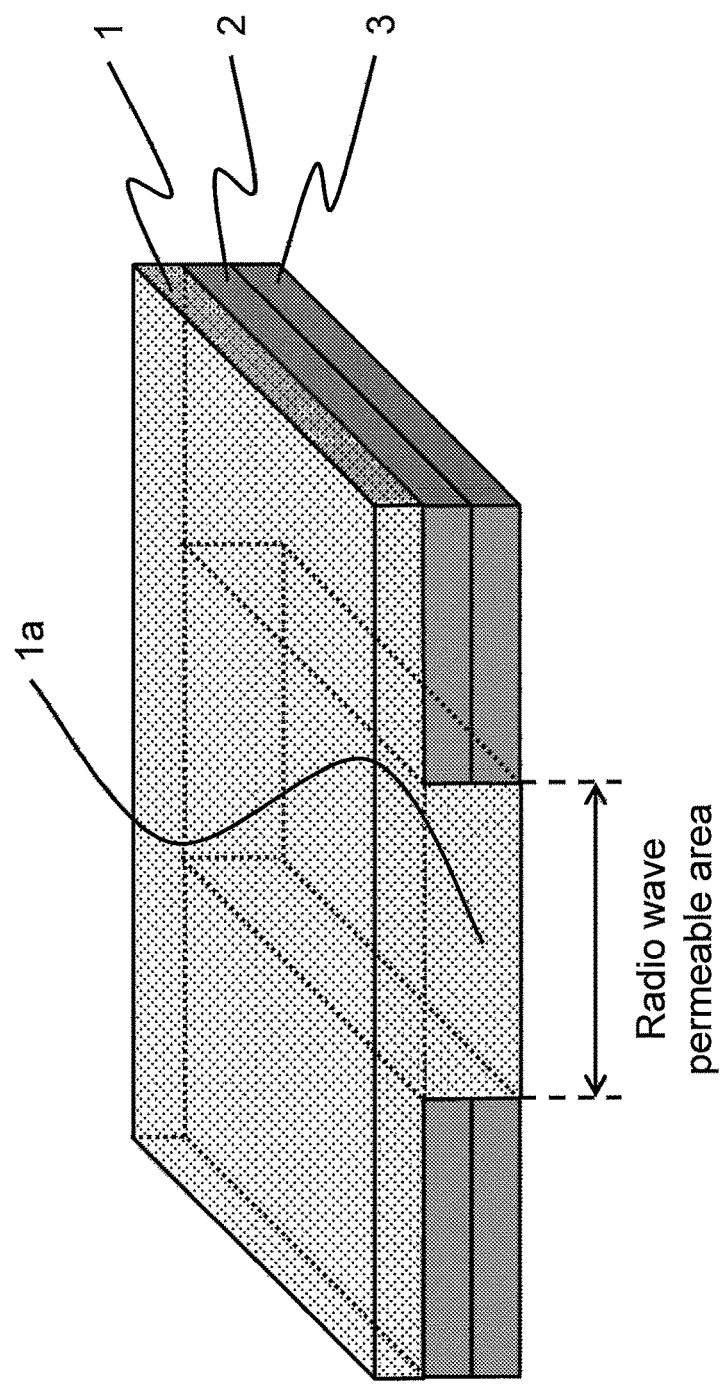
FIG. 2 is a partial transparent perspective view showing a laminate which is not the present invention.

The laminate as shown in FIG. 2 comprising the radio wave permeable member 1 having a projection 1a and the heat conducting member 2 and the rigidity retaining member 3 laminated adjacent to the projection 1a is not regarded as the laminate of the present invention. The projection area is formed solely from the radio wave permeable member in the thickness direction, and accordingly, this area will be a radio wave permeable area. In addition, the areas comprising a laminate of the radio wave permeable member 1/the heat conducting member 2/the rigidity retaining member 3 adjacent to the projection 1a of the radio wave permeable member 1 are electromagnetic wave shielding areas due to the inclusion of the heat conducting member 2 and the rigidity retaining member 3 having the electromagnetic wave shielding property in the thickness direction. However, in this case, thickness of the radio wave permeable member 1 in the radio wave permeable area is thicker than the adjacent areas due to the presence of the projection 1a, and this inhibits weight reduction.

In the present invention, it is preferable that the laminate is further provided with a heat conducting area wherein the heat conducting member is exposed, and wherein the heat conducting area is a thin area. As described above, the "thin area" refers to the situation that at least one member constituting the laminate is absent in the area, and that the area is thinner than the area including all members constituting the laminate in the thickness direction (the area including all members).

Figure 3:
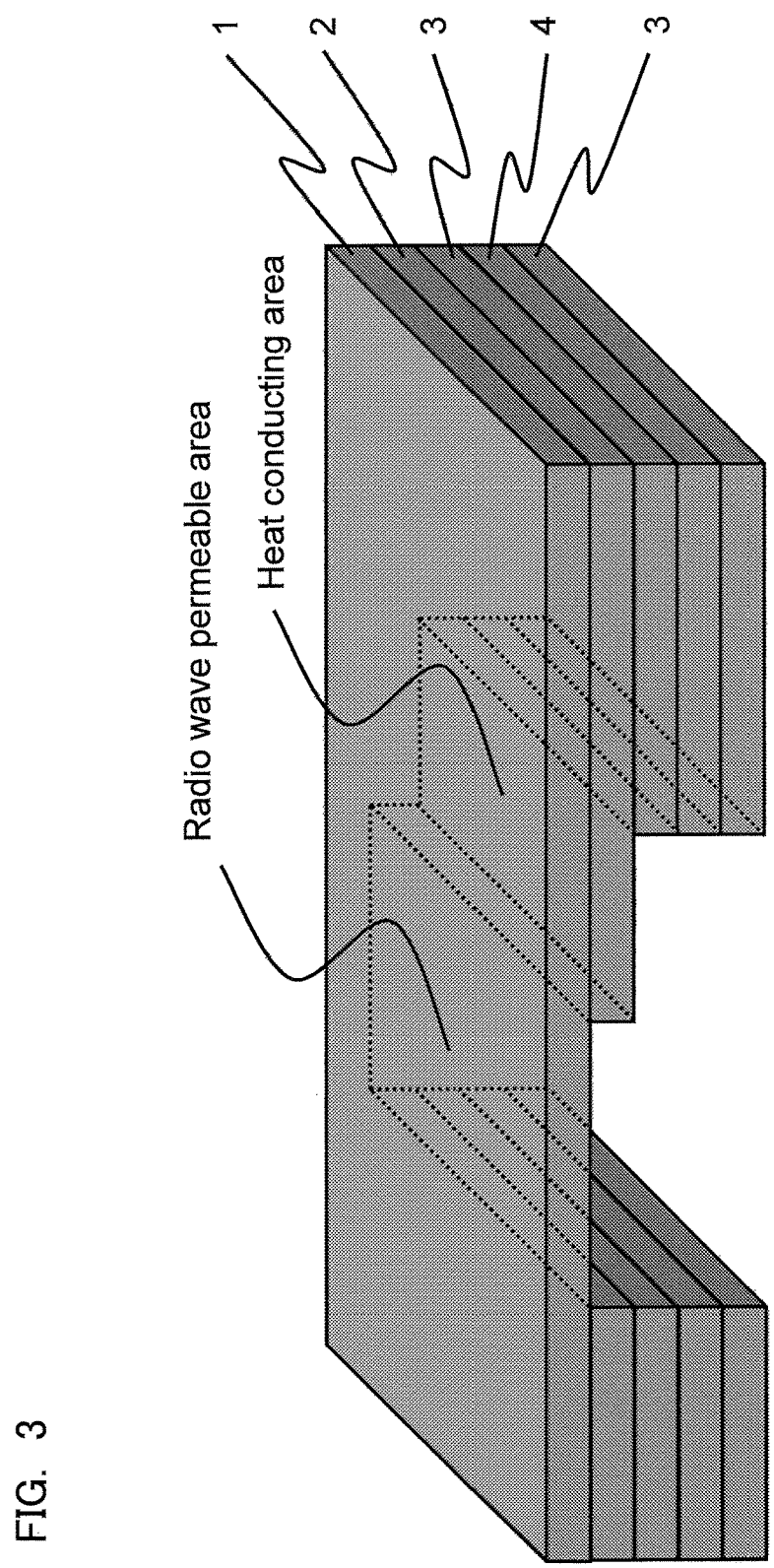
FIG. 3 is a partial transparent perspective view showing a further embodiment of the laminate of the present invention.

In the laminate shown in FIG. 3, the area solely comprising the radio wave permeable member 1 serves the radio wave permeable area, and the area other than the radio wave permeable area serves the electromagnetic wave shielding area since the heat conducting member 2 and/or the rigidity retaining member 3 having the electromagnetic wave shielding property is present in such area. This laminate also has a heat conducting area wherein the heat conducting member is exposed in the thickness direction, and this area is thinner than the area having the constitution of the radio wave permeable member 1/the heat conducting member 2/the rigidity retaining member 3/the low density member 4/the rigidity retaining member 3. The laminate having such constitution has a heat conducting area in addition to the radio wave permeable area and the electromagnetic wave shielding area in the plane of the laminate. Since the heat conducting area and the radio wave permeable area respectively constitute a thinner area in relation to the area wherein all members constituting the laminate are present in the thickness direction (area including all members), for example, the area in the case of the FIG. 3 having the constitution of the radio wave permeable member 1/the heat conducting member 2/the rigidity retaining member 3/the low density member 4/the rigidity retaining member 3, provision of such thinner area results in the reduced entire thickness when heat generating parts such as CPU or antenna are mounted on the laminate. Furthermore, provision of the area wherein all members constituting the laminate are present in the thickness direction (area including all members) realizes a laminate having excellent rigidity and reduced weight since the laminate constitution includes the sandwich structure of the rigidity retaining member 3/low density member 4/rigidity retaining member 3 in addition to the radio wave permeable member 1 and heat conducting member 2.

Next, the radio wave permeable member, the heat conducting member, the rigidity retaining member, and the low density member are described. These members are functional members each having its function, and when one material has two or more functions, the member is treated as a member simultaneously serving as the corresponding two or more functional members.

The radio wave permeable member is formed from a material having the radio wave permeability. The material used for the radio wave permeable member is not particularly limited as long as the material is the one having the radio wave permeability. Exemplary preferable materials used for constituting the radio wave permeable member include thermosetting resins, thermoplastic resins, and ceramic materials. Addition of non-conductive fillers such as non-conductive fiber to the thermosetting resin, thermoplastic resin, or the like is also preferable in view of improving the size stability and reinforcement effects without detracting from the radio wave permeability.

More specifically, the radio wave permeable member preferably comprises a fiber reinforced plastic containing at least one non-conductive fiber selected from organic fibers and ceramic fibers. The fiber reinforced plastic comprises a resin which is a thermosetting resin or a thermoplastic resin and a fiber which is preferably a non-conductive fiber in view of the radio wave permeability. Exemplary organic fibers include aramid fiber, PBO fiber, polyphenylene sulfide fiber, polyester fiber, acryl fiber, nylon fiber, and polyethylene fiber and exemplary ceramic fibers include glass fiber, silicon carbide fiber, and silicon nitride fiber, and these fibers may be used in combination of two or more. These fibers may be subjected to a surface treatment such as a treatment using a coupling agent, a treatment using a sizing agent, and a treatment wherein an additive is deposited. Of these, the non-conductive fiber preferably at least contains a glass fiber in view of the radio wave permeability and specific rigidity, and weight content of the glass fiber in the non-conductive fiber is preferably 40 to 100% by weight, more preferably 50 to 100% by weight, and more preferably 60 to 100% by weight in relation to the entire weight of the non-conductive fiber. The most preferred is the case wherein the non-conductive fiber substantially comprises a glass fiber in view of realizing the radio wave permeability. The expression "substantially comprises a glass fiber" means that the non-conductive fiber contains at least 95% by weight of the glass fiber including the impurities such as fibers not fulfilling the function of the reinforcing fiber.

Exemplary thermosetting resins which may be used for the radio wave permeable member include unsaturated polyester, vinyl ester resin, epoxy resin, phenol (resol type) resin, urea-melamine resin, thermosetting polyimide, and copolymers thereof, modified resins thereof, and resins prepared by blending two or more of such resins. Of these, the preferred are those including an epoxy resin. A filler or additive may be incorporated in the thermosetting resin depending on the intended application. Exemplary such fillers or additives include elastomer or rubber component, inorganic filler, flame retardant, conductivity imparting agent, antimicrobial agent, insect repellent, deodorizer, anti-colorant, mold release agent, antistatic agent, plastic agent, colorant, pigment, dye, foaming agent, anti-foaming agent, and coupling agent.

Exemplary thermoplastic resins that can be used for the radio wave permeable member include polyesters such as polyethylene terephthalate (PET), polybutylene terephthalate (PBT), polytrimethylene terephthalate (PTT), polyethylene naphthalate (PEN), and liquid crystal polyester; polyolefins such as polyethylene (PE), polypropylene (PP), and polybutylene; styrene resins, polyoxymethylene (POM), polyamide (PA), polycarbonate (PC), polymethylene methacrylate (PMMA), polyvinyl chloride (PVC), polyphenylene sulfide (PPS), polyphenylene ether (PPE) (including modified PPE), thermoplastic polyimide (PI), polyamideimide (PAI), polyetherimide (PEI), polysulfone (PSU) (including modified PSU), polyether sulfone (PES), polyketone (PK), polyether ketone (PEK), polyether ether ketone (PEEK), polyether ketone ketone (PEKK), polyallylate (PAR), polyether nitrile (PEN), phenoxy resin, fluoro resin (for example, polytetrafluoroethylene); as well as thermoplastic elastomers such as polystyrene, polyolefin, polyurethane, polyester, polyamide, polybutadiene, polyisoprene, fluorine thermoplastic elastomers; copolymers thereof, modified resins thereof, and resins prepared by blending two or more of such resins. The thermoplastic resin may also have an elastomer or a rubber component added therein for the purpose of improving the impact resistance. In view of heat resistance and chemical resistance, the preferred is PPS, and in view of the appearance and size stability of the molded article, the preferred are polycarbonate and styrene resins. In view of the strength and impact resistance of the molded article, the preferred is polyamide. The thermoplastic resin may also have other fillers or additives incorporated therein. Exemplary such fillers and additives include inorganic filler, flame retardant, conductivity imparting agent, nucleating agent, UV absorber, antioxidant, vibration-damping agent, antimicrobial agent, insect repellent, deodorizer, anti-colorant, heat stabilizer, mold release agent, antistatic agent, plastic agent, lubricating agent, colorant, pigment, dye, foaming agent, anti-foaming agent, and coupling agent.

Preferably, a flame retardant is added to the resin used for the radio wave permeable member 1 to provide flame resistance with the member to thereby reliably realize safety even if ignition occurred from electronic circuit in the electronic equipment casing. In such point of view, both the thermosetting resin and the thermoplastic resin may preferably contain a flame retardant. Exemplary preferable flame retardants used include phosphorus and phosphorus compounds that impart flame retardancy, for example, phosphorus-containing compounds such as phosphate ester, fused phosphate ester, and phosphaphenanthrene compounds and red phosphorus. Of these, red phosphorus is the preferable flame retardant because of its high content of the phosphorus atom that contributes for the provision of the flame retardancy, and hence, reduced amount of the flame retardant that should be added to realize the sufficient flame retardancy effect. Use of a flame retardant aid in addition to the flame retardant is also preferable in view of improving the flame retardancy. Preferable examples of the flame retardant aid include metal hydroxides such as aluminum hydroxide, magnesium hydroxide, calcium hydroxide, and tin hydroxide, inorganic compounds such as calcium aluminate and zirconium oxide, and nitrogen compounds such as melamine cyanurate as well as silicone compounds and phenol compounds.

The heat conducting member is a member fulfilling the function of electromagnetic wave shielding property and high thermal conductivity. In view of improving the thermal conductivity of the laminate, this member is formed from a material having a high thermal conductivity. While the materials having the high thermal conductivity are not particularly limited, the preferred are, for example, ceramic materials and metal materials. Also preferred are recently developed resins with high thermal conductivity whose thermal conductivity has been improved by the addition of a highly heat conductive filler. Exemplary ceramic materials include silica, zirconia, alumina, boron nitride, silicon carbide, silicon nitride, and carbon materials, and exemplary metal materials include elements selected from titanium, steel, aluminum, magnesium, iron, silver, gold, platinum, copper, and nickel and alloys thereof. The metal material may be used in the form of a film or a sheet, or alternatively, a thin film form formed by a thin film-forming method such as vacuum deposition, sputtering or vapor deposition. The material as mentioned above may also be used in combination of two or more.

The heat conducting member may preferably have a thermal conductivity of at least 10 W/mK, more preferably in the range of at least 10 W/mK and up to 3000 W/mK, and still more preferably in the range of at least 100 W/mK and up to 3000 W/mK, and most preferably in the range of at least 200 W/mK and up to 3000 W/mK. When the heat conducting member has the thermal conductivity in such range, the heat conducting area having the heat conducting member exposed will exhibit sufficient thermal conductivity. It is to be noted that the thermal conductivity of the heat conducting member can be measured by using a molded article solely comprising the member to be measured and measuring this article by laser flash method.

The rigidity retaining member is a member bearing the functions of electromagnetic wave shielding property and high rigidity. By incorporating the rigidity retaining member in the laminate, the laminate will be provided with an improved rigidity. By selecting a material having a high rigidity for the rigidity retaining member, the laminate will be reliably provided with the rigidity. In view of improving the rigidity of the laminate, a material having a high flexural modulus may be used for the rigidity retaining member. In the present invention, the member comprising a material having a highest flexural modulus in the materials having the electromagnetic wave shielding property used for the laminate is defined the rigidity retaining member. In addition, the area including the rigidity retaining member and the area having the highest rigidity in the plane of the laminate is defined the rigidity retaining area. It is to be noted that a material having a flexural modulus of at least 30 GPa is generally used for the rigidity retaining member. The flexural modulus of the rigidity retaining member is preferably at least 50 GPa, and more preferably at least 100 GPa. The flexural modulus of the rigidity retaining member may be measured according to ASTM D790 by using a molded article solely comprising the member to be measured and using the spun which is 32 times the thickness of the test piece. The flexural modulus of the rigidity retaining area, the area including all members, and the like of the laminate may be measured according to ASTM D790 by collecting the test piece from the area to be measured so that the area thickness is the thickness of the test piece, and using the spun which is 32 times the thickness of the test piece.

In the present invention, the rigidity retaining member preferably also has a flexural modulus higher than that of the radio wave permeable member. When the flexural modulus of the rigidity retaining member is higher than that of the radio wave permeable member, the laminate will be provided with a higher rigidity. In order to increase contribution of the rigidity retaining member to the rigidity of the laminate, the rigidity retaining member is preferably arranged at a position at or near the surface layer of the laminate while considering the balance of the radio wave permeability performance and the design.

The rigidity retaining member is preferably formed from a fiber reinforced plastic containing the conductive fiber. Exemplary conductive fibers include metal fibers such as aluminum fiber, brass fiber, and stainless steel fiber, polyacrylonitrile fibers, rayon fibers, lignin fibers, carbon fibers such as pitch carbon fibers (including graphite fibers), which may be used alone, in combination of two or more, or in combination with a fiber other than the conductive fiber such as an insulating fiber.

The resin used for the fiber reinforced plastic of the rigidity retaining member may be either a thermosetting resin or a thermoplastic resin, and the resin may be any one of the resins mentioned for the radio wave permeable member as described above. In addition, the resin may be provided with flame resistance by adding a flame retardant to the resin used for the rigidity retaining member. The flame retardant used herein may be any of the flame retardants described for the radio wave permeable member as described above.

The conductive fiber used for the fiber reinforced plastic of the rigidity retaining member preferably contains a carbon fiber. Of the conductive fibers as mentioned above, the preferred is use of the carbon fiber in view of effectively improving lightness and rigidity of the laminate.

In addition, the conductive fiber used for the rigidity retaining member is preferably a continuous conductive fiber, and more preferably, a continuous conductive fiber having an average fiber length of at least 10 mm. Use of the continuous conductive fiber enables efficient realization of the reinforcement effect of the conductive fiber compared to the use of the discontinuous conductive fiber. Exemplary preferable forms of the conductive fiber layer include cloths as well as filaments, braids, filament bundles, spun yarns, and the like aligned in one direction. Also preferred is the technique of forming a layer by aligning the conductive fibers in one direction and laminating such layers so that the direction of the conductive fibers is different for each layer to thereby reduce mechanical anisotropy of the laminate. The layer form may be used alone or in combination of two or more layer. Of these, in view of the good electric conductivity, high electromagnetic wave shielding property, and good balance of the specific strength, specific rigidity, and lightness of carbon fiber, and also in view of realizing the low cost, the preferred is use of a polyacrylonitrile carbon fiber. In particular, when a carbon fiber is used for the conductive fiber in the rigidity retaining member, the most preferable embodiment is use of a continuous carbon fiber for the continuous carbon fiber.

When the rigidity retaining member is formed from a fiber reinforced plastic containing a carbon fiber, the fiber reinforced plastic is preferably the one having a fiber content (by weight) of the carbon fiber in the range of at least 15% by weight and up to 80% by weight. When the fiber content (by weight) is less than 15% by weight, the electromagnetic wave shielding property and the rigidity are easily lost detracting from fulfilling the desired function. When the fiber content (by weight) is in excess of 80% by weight, the material is likely to suffer from the problem of void generation in the fiber reinforced plastic and molding may become difficult. Preferably, the fiber content (by weight) of the carbon fiber is at least 25% by weight and up to 75% by weight, and more preferably at least 30% by weight and up to 70% by weight.

The low density member is a member constituted from a material having a density of less than 1 g/cm$^3$. By including a low density member in the laminate, the laminate will enjoy greater lightness. In view of improving the lightness of the laminate, the member may preferably have a lowest possible density. The material used for the low density member is not particularly limited, and exemplary materials include thermoplastic resins and thermosetting resins, for example, those mentioned for the radio wave permeable member. Also preferred is a material prepared by expanding the fiber reinforced plastic containing such resin and the reinforcing fiber in the thickness direction. Exemplary reinforcing fibers incorporated in such material include the reinforcing fibers mentioned for the rigidity retaining member.

In the present invention, at least one radio wave permeable member is preferably disposed on the design surface side of the heat conducting member and/or the rigidity retaining member. Furthermore, at least one radio wave permeable member is preferably disposed on the outermost surface on the design surface side. When a radio wave permeable area solely constituted from the radio wave permeable member is provided, a laminate having excellent design property wherein the step or the line of junction generated between the different materials is less likely to be visually recognizable on the design surface can be obtained by disposing the radio wave permeable member on the design surface side of a members having the electromagnetic wave shielding property, for example, the heat conducting member and the rigidity retaining member. It is to be noted that the design surface is the surface provided for the purpose of improving the design property of the product.

Figure 4:
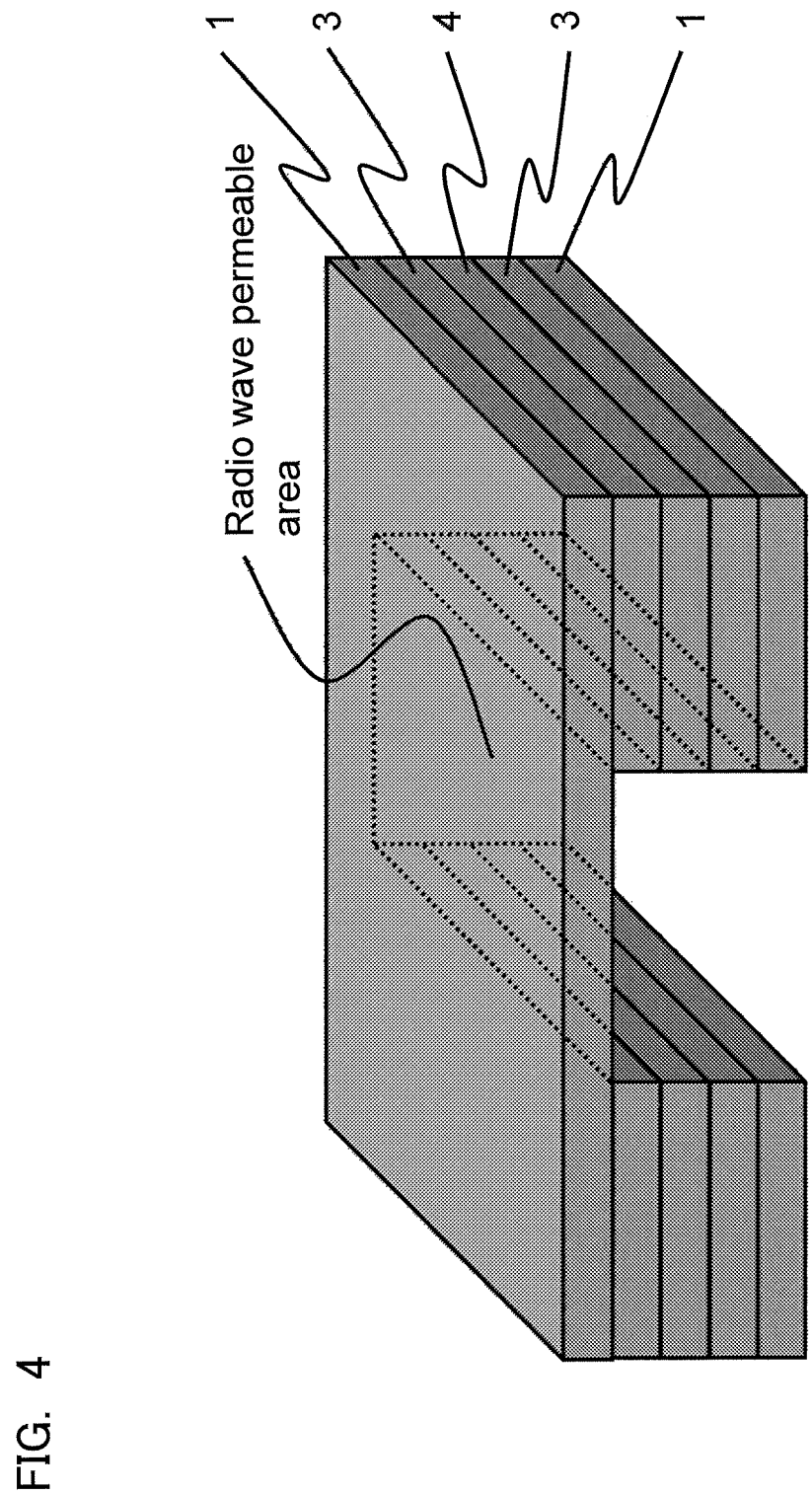
FIG. 4 is a partial transparent perspective view showing a still further embodiment of the laminate of the present invention.
Figure 5:
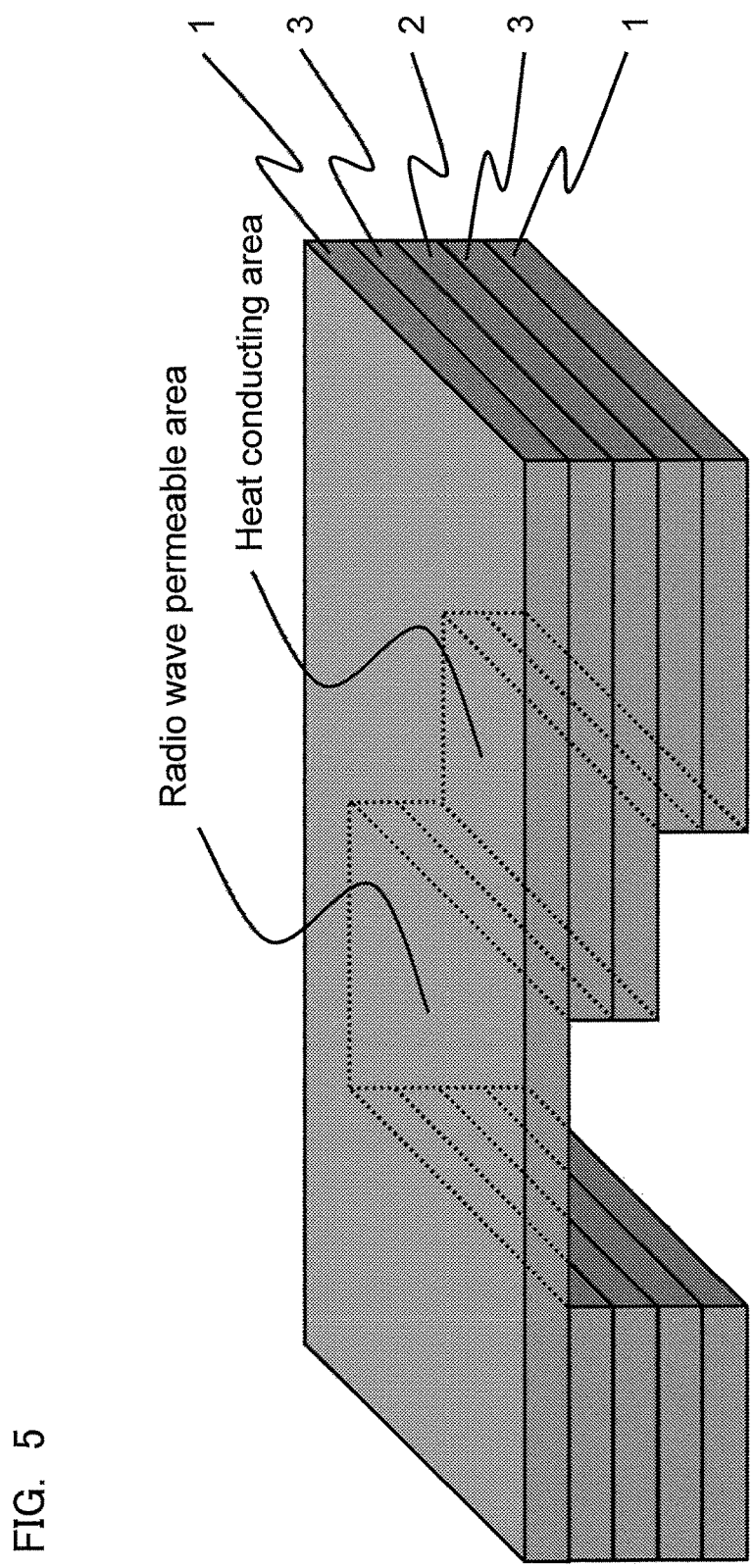
FIG. 5 is a partial transparent perspective view showing a still further embodiment of the laminate of the present invention.

In the present invention, the members constituting the laminate are preferably disposed so that the members are symmetrical in the thickness direction, and the heat conducting member is at the center of the thickness. For example, when the laminate is constituted in the symmetrical constitution of the radio wave permeable member 1/the rigidity retaining member 3/the low density member 4/the rigidity retaining member 3/the radio wave permeable member 1 as shown in FIG. 4, difference in the heat shrinkage between the member in the production of the laminate by press molding can be nulled to thereby suppress the warping. More preferably, the laminate is constituted in the symmetrically constitution of the radio wave permeable member 1/the rigidity retaining member 3/the heat conducting member 2/the rigidity retaining member 3/the radio wave permeable member 1 as shown in FIG. 5 with the heat conducting member 2 at the center in the thickness direction. Generally, many of the heat conducting member 2 showing a high thermal conductivity are metal materials having a high density, and in view of reducing the weight, use of the heat conducting member 2 can be limited to one layer at the center by using the laminate structure shown in FIG. 5, and the laminate will enjoy the light weight.

Figure 6:
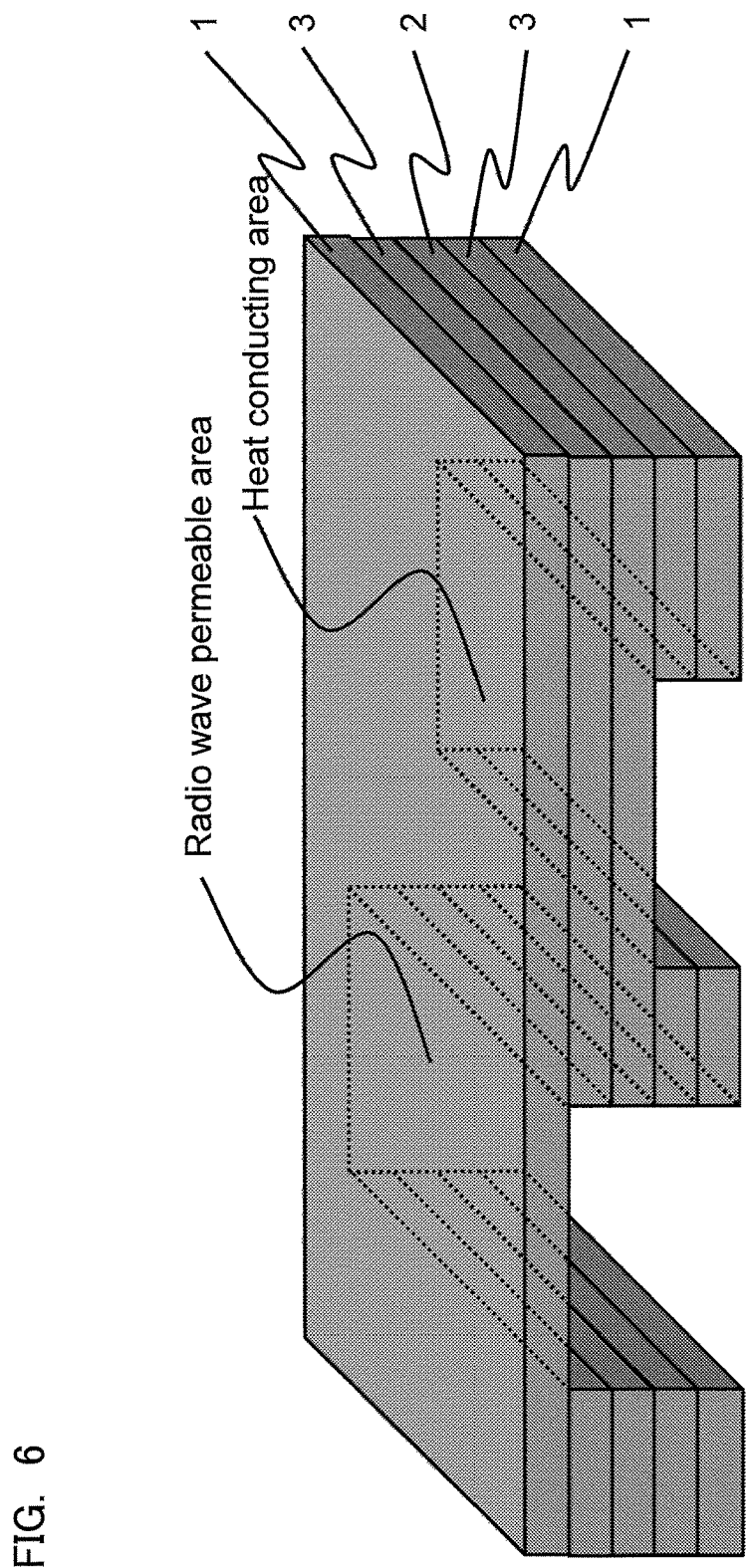
FIG. 6 is a partial transparent perspective view showing a still further embodiment of the laminate of the present invention.
Figure 7:
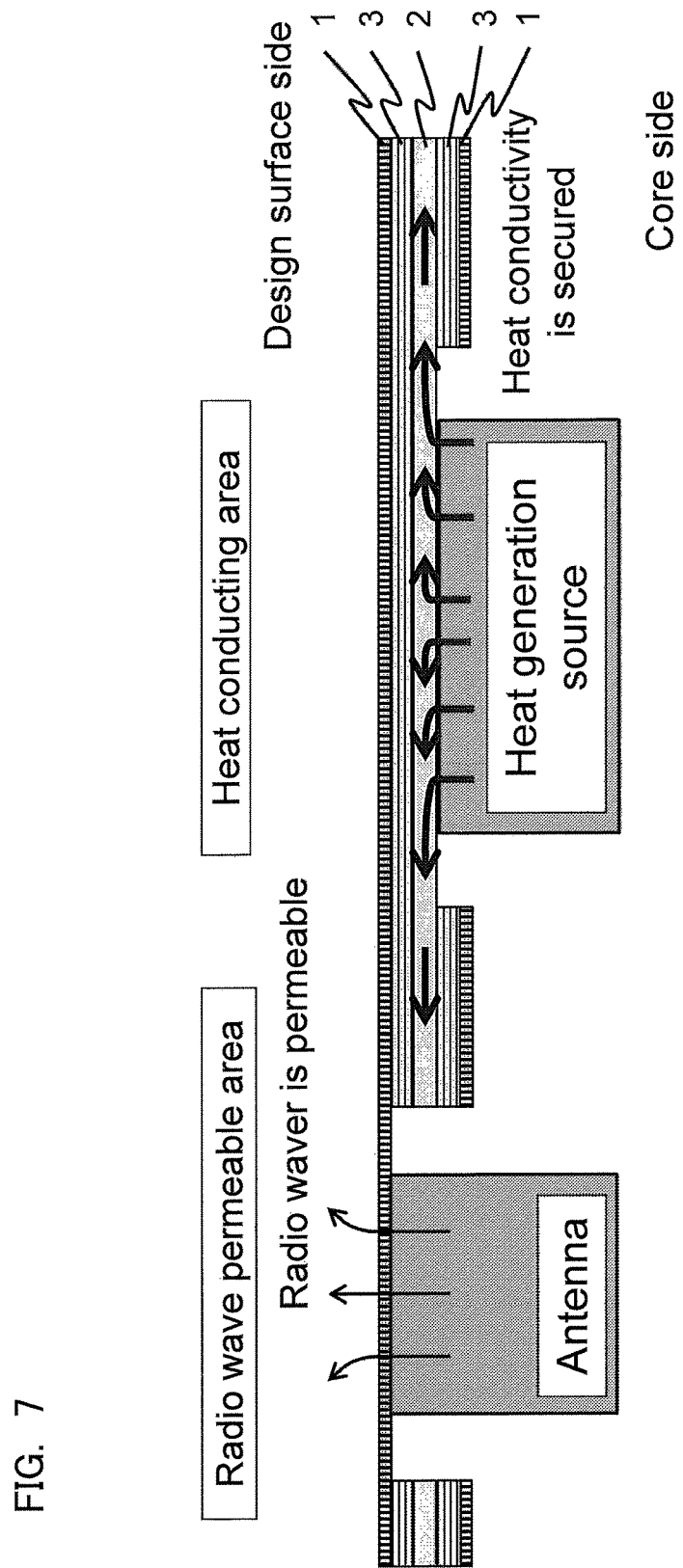
FIG. 7 is a cross sectional view showing an embodiment of the laminate according to the present invention having electronic parts mounted therein.

In the present invention, the radio wave permeable area and the heat conducting area may be provided either adjacent to each other or remote from each other. As shown in FIG. 6, the radio wave permeable area solely comprising the radio wave permeable member 1 in the thickness direction of the laminate may be provided in a part of the plane of the laminate, and a heat conducting area having the heat conducting member 2 exposed in the thickness direction of the laminate may also be provided in a part of the plane of the laminate, so that the radio wave permeable area and the heat conducting area are separated, namely, not continuous in the plane of the laminate. The layout of the radio wave permeable area and the heat conducting area may be freely selected depending on the electronic parts mounted therein. For example, in the embodiment of FIG. 7 wherein electronic parts are mounted in the laminate of the present invention, an antenna may be provided in the radio wave permeable area solely comprising the radio wave permeable member 1 in the thickness direction, and the part which is the heat source may be provided in the heat conducting area having the heat conducting member 2 exposed in the thickness direction of the laminate so that the laminate is simultaneously provided with the functions of the radio wave permeability and the high thermal conductivity.

In the present invention, the radio wave permeable member preferably has an electric field shielding property measured by KEC method of at least 0 dB and less than 20 dB in the frequency band of 1 GHz.

Figure 8:
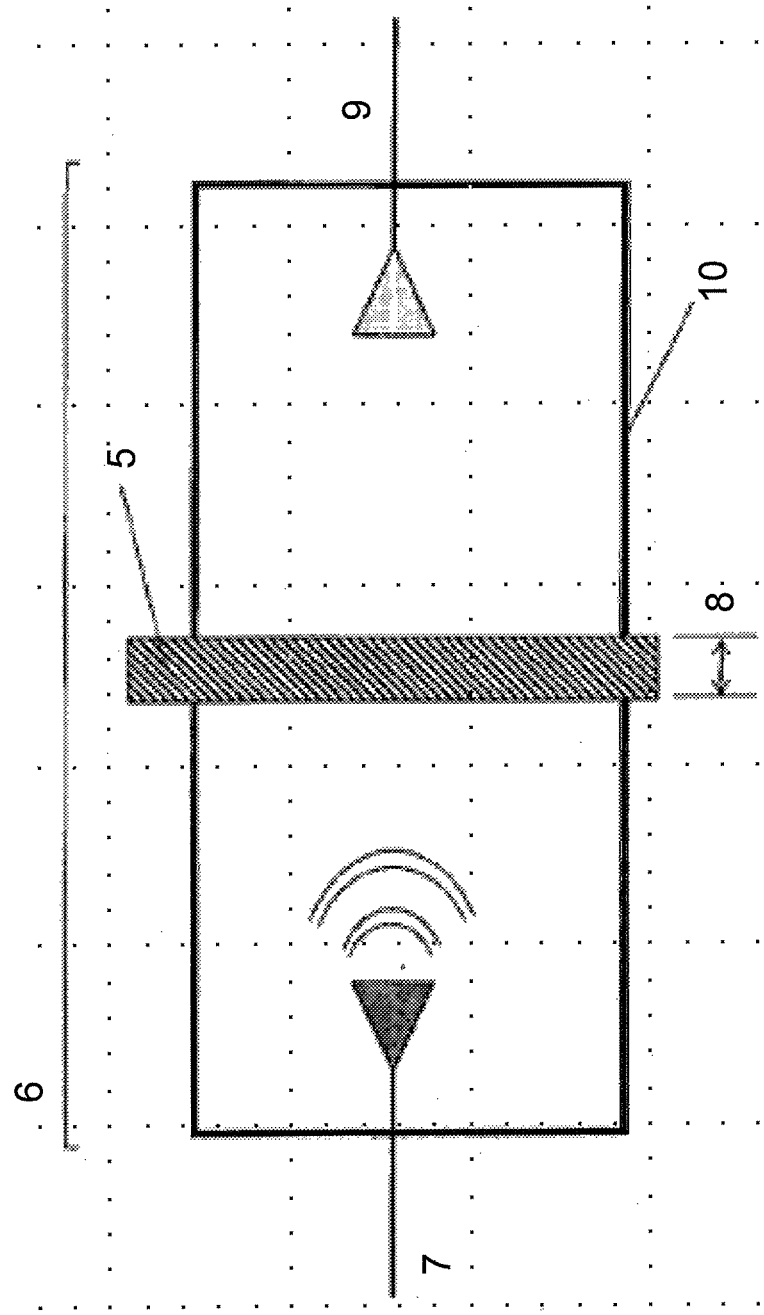
FIG. 8 is a schematic view showing an apparatus for measuring electric field shielding property.

The electric field shielding property of the laminate may be determined by measuring each member constituting the laminate. The electric field shielding property of each member may be determined by measuring a molded article solely comprising the member. More specifically, a molding precursor comprising a plurality of single material sheets is molded under the same molding conditions as the production of the laminate and the molded article having the substantially same thickness as the laminate is used to measure the electric field shielding property. The "substantially same thickness" as used herein means the target thickness ±0.05 mm. When the molded article has a thickness within such range, no significant difference in the evaluation results of the electromagnetic wave shielding property is found in most cases. In the present invention, the electric field shielding property is used for the scale of the electromagnetic wave shielding property. Schematic view of the measurement apparatus of the electric field shielding property is shown in FIG. 8. When the molded article solely comprising the radio wave permeable member has an electric field shielding property as measured by KEC method in the range of at least 0 dB and less than 20 dB in the frequency band of 1 GHz, the radio wave permeable area will be provided with a sufficient radio wave permeability. The electric field shielding property is more preferably in the range of at least 0 dB and up to 10 dB, and still more preferably in the range of at least 0 dB and up to 5 dB.

In addition, in the present invention, the rigidity retaining member and the heat conducting member may preferably have an electric field shielding property as measured by KEC method in the range of at least 20 dB and up to 80 dB in the frequency band of 1 GHz.

When the rigidity retaining member and the heat conducting member have an electric field shielding property as measured by KEC method in the range of at least 20 dB and up to 80 dB in the frequency band of 1 GHz, the electromagnetic wave shielding area will be reliably provided with sufficient electromagnetic wave shielding property. The electric field shielding property is more preferably in the range of at least 30 dB and up to 80 dB, and still more preferably in the range of at least 50 dB and up to 80 dB.

Another preferable embodiment of the present invention is preparation of an integrally molded article by integrating the laminate as described above with a different member. In this process the different member is preferably integrated by injection molding.

While the laminate as described above may be used for the electronic equipment casing or the like with no further processing, the molded laminate may be integrated with a different member having complicated shape such as boss or rib for use as an integrally molded article with improved function as the casing. The method used for the integration of other members include a method wherein other members which have been preliminarily produced are adhered to the laminate, and a method wherein the laminate is inserted in the mold for injection molding, mold is clamped, and then thermoplastic resin is injected for outsert molding to cover a part of the laminate to thereby produce an integrally molded article having the different parts provided.

Next, the production method of the laminate preferable for use in the production of the laminate of the present invention is described by referring to the drawings. For example, when the laminate as shown in FIG. 6 is to be produced, a preliminary laminate is first prepared by symmetrically laminating the radio wave permeable member/the rigidity retaining member/the heat conducting member/the rigidity retaining member/the radio wave permeable member in this order in the thickness direction. Each member is in sheet form, and in the preliminary laminate, the layer are bonded, for example, by coating an adhesive or by press molding. Next, a part of the preliminary laminate, namely, the rigidity retaining member/the heat conducting member/ the rigidity retaining member/the radio wave permeable member is cut and removed, for example, by a cutting machine such as NC cutting machine to provide the radio wave permeable area wherein the radio wave permeable member 1 is solely left in the thickness direction of the laminate. Similarly, a part of the preliminary laminate, namely the rigidity retaining member/the radio wave permeable member may be cut and removed to provide the heat conducting area wherein the heat conducting member 2 is exposed in the thickness direction of the laminate. In other words, in producing the laminate having the radio wave permeable area, a preliminary laminate comprising the sheet form radio wave permeable member and the sheet form heat conducting member and/or the sheet form rigidity retaining member in the thickness direction of the laminate is produced, and members other than the radio wave permeable member are cut and removed in the predetermined area in the plane of the preliminary laminate to form the radio wave permeable area. In the case of producing a laminate having the radio wave permeable area and the heat conducting area, a preliminary laminate comprising the sheet form radio wave permeable member and the sheet form heat conducting member laminated in the thickness direction is prepared, and the members other than the radio wave permeable member are cut and removed in the predetermined area in the plane of the preliminary laminate to form the radio wave permeable area, and also, members other than the heat conducting member are cut and removed in the predetermined area in the plane of the preliminary laminate until the heat conducting member is exposed to form the heat conducting area.

Figure 9:
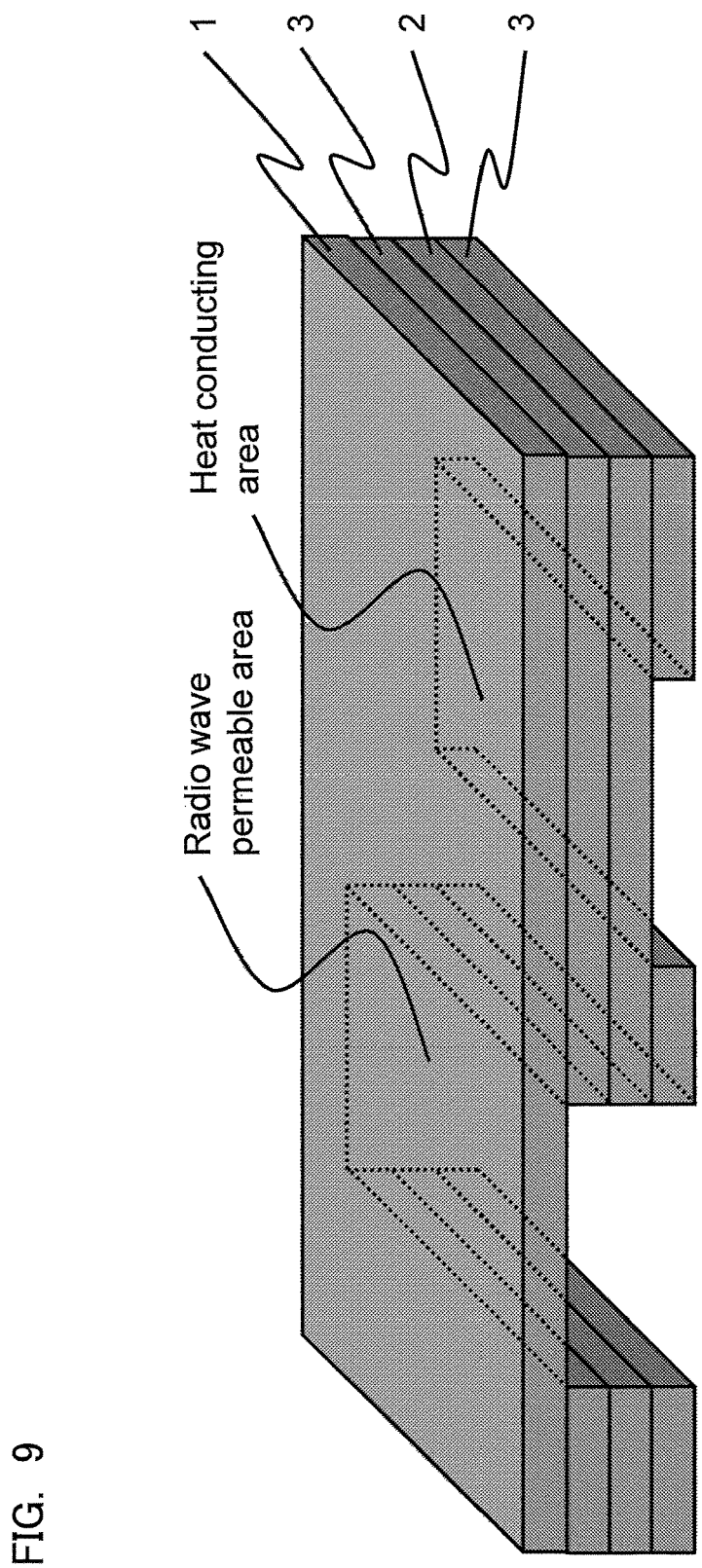
FIG. 9 is a partial transparent perspective view showing a still further embodiment of the laminate of the present invention.

Also, a laminate having the radio wave permeable area and the heat conducting area may be produced by integrating a radio wave permeable member to the preliminary laminate having the heat conducting area provided therein. For example, when a laminate as shown in FIG. 9 is produced, a part of the sheet form rigidity retaining member is cut and removed by a cutting machine such as NC cutting machine to produce a rigidity retaining member 3 having a notch in the part corresponding to the heat conducting area. Next, a preliminary laminate having the sheet form rigidity retaining member 3/the heat conducting member 2/the rigidity retaining member 3 having the notch disposed in this order is produced to provide a heat conducting area wherein the heat conducting member 2 is exposed in the notched area of the rigidity retaining member 3. Then, after forming another notch in the preliminary laminate in the area other than the heat conducting area, the radio wave permeable member 1 is disposed on the notched preliminary laminate on the side of the sheet form rigidity retaining member 3 to form a laminate of the radio wave permeable member 1/the rigidity retaining member 3/the heat conducting member 2/the rigidity retaining member 3 having the notch in this order so that the notched different area becomes the radio wave permeable area in the area from the heat conducting area of the laminate. The laminate shown in FIG. 9 is thereby produced. The layers of the laminate may be bonded, for example, by coating an adhesive between the layers or by press molding. The parts of the heat conducting area and the radio wave permeable area may be formed as through holes instead the notches.

In other words, when a laminate having the radio wave permeable area is produced, a notch or a through hole is first provided in the preliminary laminate having the sheet form heat conducting member and/or the sheet form rigidity retaining member, and then, such preliminary laminate is disposed on the sheet form radio wave permeable member to form the radio wave permeable area. In the case of producing the laminate having the radio wave permeable area and the heat conducting area, a notch or a through hole is provided in the preliminary laminate including the sheet form members other than the heat conducting member, and then, such preliminary laminate is disposed on the sheet form heat conducting member to form the heat conducting area; and after providing a notch or a through hole in the preliminary laminate having the heat conducting area in the area other than the heat conducting area, such preliminary laminate is disposed on the sheet form radio wave permeable member to form the radio wave permeable area.

When one of the radio wave permeable member, the rigidity retaining member, and the heat conducting member is a resin-containing member, the integration wherein the layers of the laminate are bonded may be conducted by press molding, and in this case, the radio wave permeable area or the heat conducting area may be provided by laminating the members which has been cut to the predetermined shape by considering the parts to be the radio wave permeable area or the heat conducting area before the press molding, and then conducting the press molding. When the radio wave permeable area is provided, a radio wave permeable area solely comprising the radio wave permeable member in the thickness direction of the laminate can be provided by disposing a member having the electromagnetic wave shielding property only in the area other than the radio wave permeable area. When the heat conducting area is provided, a laminate having the heat conducting area wherein the heat conducting member is exposed can be provided by disposing the member other than the heat conducting member in the area other than the heat conducting area on the side where the heat conducting member is exposed. It is to be noted that, for disposing the members in the area other than the radio wave permeable area or the heat conducting area, members having a notch or a through hole formed in the part which is to be the radio wave permeable area or the heat conducting area may be disposed, or alternatively, members which have been split may be disposed in the part which is other than the areas to be the radio wave permeable area or the heat conducting area.

EXAMPLES

Next, the present invention is described by referring to the Examples, which by no means limit the scope of the present invention.

First, the measurement methods used in the Examples and Comparative Examples are described with the conditions used in each measurement method.

[Measurement Method of Flexural Modulus]

Test pieces each having a length of 50 mm and a width of 25 mm (with each thickness) were cut out from the molded article comprising the material whose flexural modulus was to be measured, or the rigidity retaining area or the area including all members of the laminate whose flexural modulus was to be measured. Flexural modulus was determined according to ASTM D790 by using a spun which is 32 times the thickness of the test piece. The flexural modulus of the resulting laminate was then evaluated according to the following criteria. AA, A, and B were evaluated "pass" while C and D were evaluated "fail".

AA: at least 100 GPa
A: at least 50 GPa and less than 100 GPa
B: at least 30 GPa and less than 50 GPa
C: at least 5 GPa and less than 30 GPa
D: less than 5 GPa.

[Measurement Method of Density]

Density of the molded article comprising the material whose density was to be measured, or the rigidity retaining area or the area including all members of the laminate whose density was to be measured was determined by water displacement method. The lightness of the rigidity retaining area and the area including all members of the laminate was evaluated by dividing the density according to the following criteria. AA, A, and B were evaluated "pass" while C and D were evaluated "fail".

AA: less than 1.2 g/cm$^3$
A: at least 1.2 g/cm$^3$ and less than 1.7 g/cm$^3$
B: at least 1.7 g/cm$^3$ and less than 2.3 g/cm$^3$
C: at least 2.3 g/cm$^3$ and less than 2.5 g/cm$^3$
D: at least 2.5 g/cm$^3$.

[Measurement Method of Electric Field Shielding Property (KEC Method)]

FIG. 8 is a schematic longitudinal cross section of a measurement apparatus of the electric field shielding property. In FIG. 8, the measurement apparatus 6 of the electric field shielding property has a measurement casing comprising a metal tube 10. Inner space of the metal tube 10 is shielded from outer field. A signal transmitter antenna 7 and a signal receiver antenna 9 are provided in the inner space of the metal tube 10. The metal tube 10 allows insertion of a test specimen 5 between the antennas from the exterior of the metal tube 10. The test specimen 5 has a test specimen thickness 8.

In the space shielded in the metal tube 10, the test specimen 5 is inserted between the signal transmitter antenna 7 and the signal receiver antenna 9 to measure the electric field strength in the presence and absence of the test specimen.

The electric field strength both in the presence and absence of the test specimen 5 is measured by the measurement apparatus 6. By designating the electric field strength of the space in the absence of the test specimen as $E_0$ [V/m] and the electric field strength of the space in the presence of the test specimen as $E_x$ [V/m], the electric field shielding property is determined by the following equation. The plus and the minus signs of the value measured indicate the direction the positive direction has in the shielding effect.

Electric field shielding property (shielding effect)=20 $\log_{10} E_0/E_x$ [dB]

The radio wave permeability was determined from the measurement results of the electric field shielding property measured for the radio wave permeable area. The radio wave permeability was evaluated by the following criteria, namely, A when the electric field shielding property was at least 0 dB and less than 10 dB; B when the electric field shielding property was at least 10 dB and less than 20 dB; and A and B were evaluated as "pass". The radio wave permeability was evaluated C when the electric field shielding property was at least 20 dB, and C was evaluated as "fail". The evaluation was "not evaluated (–)" when the radio wave permeable area was absent in the laminate.

Also, the electromagnetic wave shielding property was determined from the measurement results of the electric field shielding property measured for the electromagnetic wave shielding area. The electric field shielding property was evaluated by the following criteria, namely, A when the electric field shielding property was at least 50 dB; B when the electric field shielding property was at least 20 dB and less than 50 dB; and A and B were evaluated as "pass". The electric field shielding property was evaluated C when the electric field shielding property was less than 20 dB, and C was evaluated as "fail". The evaluation was "not evaluated (–)" When the electromagnetic wave shielding area was absent in the laminate.

[Measurement Method of Thermal Conductivity]

A disk-shaped sample having a diameter of 10 mm and a thickness of 3 to 6 mm was prepared from the molded article comprising the material whose thermal conductivity was to be measured, and specific heat and diffusivity of heat of the molded article were measured by using a thermal constant measurement apparatus TC-3000 for laser flash method manufactured by Sinku Riko Co, Ltd., and the thermal conductivity was calculated by the following equation:

$K = Cp \times \alpha \times \rho$

In the equation, K is thermal conductivity of the molded article, Cp is specific heat of the molded article, α is heat diffusivity of the molded article, and ρ is density of the molded article. Thickness of the molded article was changed depending on the thermal conductivity of the molded article, and a thicker sample was used for the sample having a high thermal conductivity while a thinner sample was used for the sample having a low thermal conductivity. More specifically, while several dozen msec. are required for the sample rear surface to reach the highest temperature after the laser irradiation, the sample thickness was adjusted so that the time $t_{1/2}$ which is the time required for the increase of the temperature corresponding to ½ of the temperature increase ΔTm will be at least 10 msec. (15 msec. at the maximum).

The specific heat was determined by attaching a glassy carbon on the front surface of the sample as a light receiving plate and measuring the temperature increase after the laser irradiation by the R thermocouple attached to the center of the sample rear surface. The value measured was calibrated by using sapphire for the standard sample. The heat diffusivity was determined by coating opposite surfaces of the sample with a carbon spray until no surface was exposed, and measuring the temperature change of the sample rear surface after the laser irradiation by using an infrared detector. It is to be noted that, when the thermal conductivity exhibited anisotropy, the maximum measurement was used as the representative value.

[Evaluation Method of Heat Dissipation Property]

Figure 10:
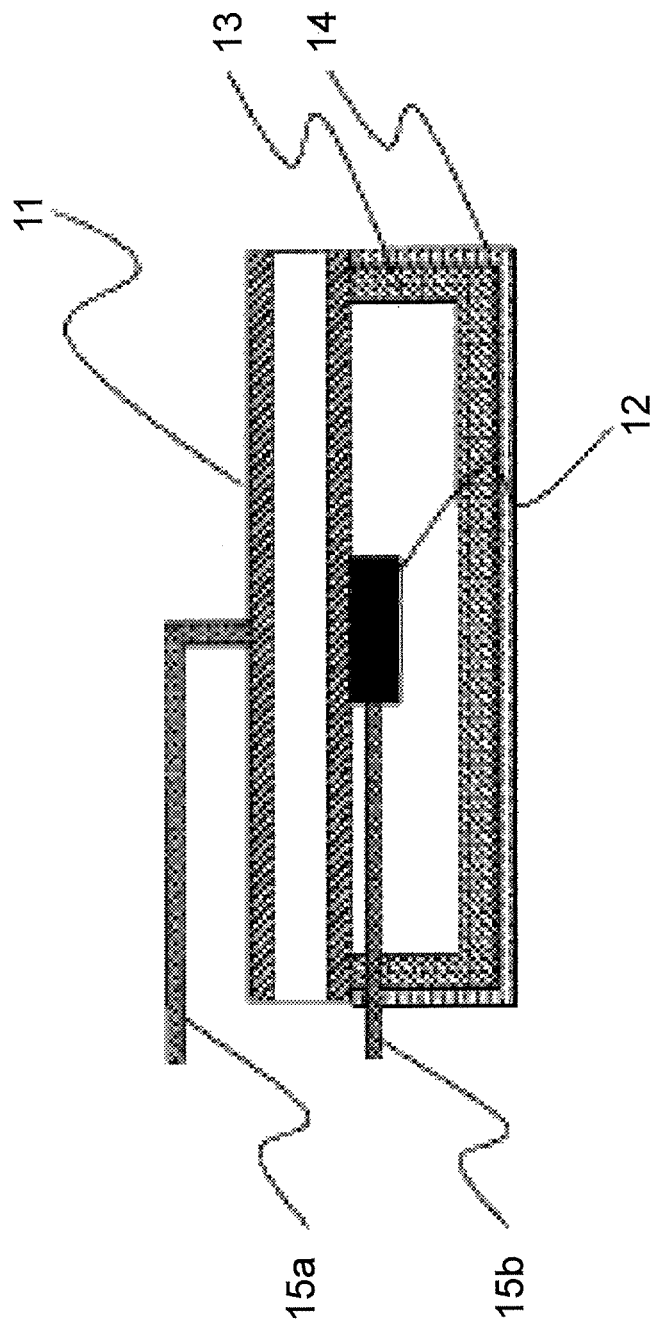
FIG. 10 is a schematic cross sectional view showing an apparatus for evaluating heat dissipation property.
FIG. (a) is a cross sectional view showing an embodiment of the laminate of the present invention. FIG. (b) is a cross sectional view showing the laminate of (a) which has been cut and separated.

A test piece with the size of 120×150 mm was cut out from the heat conducting area of the laminate. A heat generating member was secured with an adhesive to the central part of the thus cut out test piece on the side of the heat conducting member. Next, as shown in FIG. 10, the test piece 11 having the heat generating member 12 adhered thereto was placed on the heat dissipation property evaluating device formed from an insulating board 14 and an aluminum tape 13. It is to be noted that the heat generating member had a cylinder shape with the diameter of 15 mm.

Then, a power of 8 W was applied to the heat generating member for 5 minutes in an atmosphere of room temperature of 23° C. and humidity of 55%, and after 10 minutes, temperature of the heat generating member and temperature of the rear surface (on the side of outer atmosphere) of the test piece having the heat generating member attached thereto were respectively measured by a thermocouple 15b and a thermocouple 15a. The difference in their measurements was used as the basis for evaluating the heat dissipation property. The position of the measurement on the rear surface (on the side of outer atmosphere) of the test piece was 50 mm from the center of the test piece in the longitudinal direction of the test piece.

The measurements of the heat dissipation property were evaluated by the temperature difference between the two measurements, and the evaluation results was A when the temperature difference was less than 20° C., and B when it was at least 20° C. and less than 40° C. While A and B were evaluated "pass", the temperature difference of 40° C. or more was evaluated C and "fail". When the laminate had no heat conducting area, the evaluation was "not evaluated (–)". It is to be noted that, when the material included an anisotropic material, the measurement was conducted for the area in the directions of 0°, and then at 90°, after rotation to the perpendicular direction, and the average of the temperature difference measurements was used for the evaluation basis.

Next, the materials used in the Examples and the Comparative Examples are described. The properties are shown in Table 1.

(Material 1) Glass Fiber-Reinforced Sheet

Glass fiber cross-prepreg R-5 (manufactured by Nitto Boseki Co., Ltd.; containing glass fiber and epoxy resin; glass fiber content (by weight), 60% by weight; thickness 0.143 mm)

(Material 2) Aluminum Sheet

Aluminum sheet AL5052 (thickness 0.15 mm)

(Material 3) Carbon Fiber-Reinforced Sheet

Carbon fiber unidirectional prepreg P3052S-15 (manufactured by Toray; containing carbon fiber (T700S) and epoxy resin; carbon fiber content (by weight) 67% by weight; thickness 0.143 mm)

(Material 4) Polypropylene Sheet

90% by weight of an unmodified polypropylene ("Prime Polypro" (Registered Trademark) J105G having a melting point of 160° C. manufactured by Prime Polymer Co., Ltd.) and 10% by weight of an acid-modified polypropylene ("ADMER" (Registered Trademark) QE510 having a melting point of 160° C. manufactured by Mitsui Chemicals, Inc.) were dry blended. The dry blend was injected in the hopper of a twin-screw extruder for melt-kneading in the extruder, and the resin was extruded from T die having a width of 400 mm. The extruded sheet was taken up by a chill roll at 60° C. for solidification by cooling to prepare a polypropylene sheet (material 4) having a thickness of 0.3 mm.

TABLE 1

| | | | Material 1 | Material 2 | Material 3 | Material 4 |
|---|---|---|---|---|---|---|
| Constitution of the material | Type of the material | — | Glass fiber reinforced sheet | Aluminum sheet | Carbon fiber reinforced sheet | Polypropylene sheet |
| | Type of the fiber used for the reinforcement | — | Glass fiber | — | Carbon fiber | — |
| | Type of the resin | — | Epoxy resin | — | Epoxy resin | Polypropylene |
| | Weight content of the reinforcing fiber | % by weight | 60 | — | 67 | — |
| | Thickness | mm | 0.143 | 0.15 | 0.143 | 0.3 |
| Property | Flexural modulus | GPa | 25 | 70 | 160 | 1.5 |
| | Density | g/cm$^3$ | 2.0 | 2.7 | 1.6 | 0.9 |
| | Electric field shielding property | dB | 0 | 90 | 70 | 0 |
| | Thermal conductivity | W/mK | 1 | 200 | 5 | 0.1 |

Example 1

A laminate of 3 glass fiber-reinforced sheets of material 1 was prepared for use as the article to be molded. The resulting article to be molded was subjected to hot press molding, and the mold was opened 30 minutes after applying the pressure. The molded article was taken out of the press molding machine together with the tool plates to obtain a glass fiber reinforced plastic having the epoxy resin cured. In the hot press molding, the article to be molded was sandwiched between mold release films, and then, between the tool plates and placed between the plates of the press molding machine at the plate temperature of 150° C. After closing the plates, the article was pressed at a pressure of 1.5 MPa.

Next, the aluminum sheet of material 2 was cut at the predetermined size, and as shown in FIG. 11(a), the aluminum sheet of predetermined size (the second layer) was adhered to the glass fiber reinforced plastic (first layer) only at the position of the area A and the area C by using an epoxy adhesive to thereby obtain a laminate. The surface of the glass fiber reinforced plastic opposite to the surface having the aluminum sheet adhered thereto was used for the design surface. It is to be noted that the glass fiber reinforced plastic corresponds to the radio wave permeable member, and the aluminum sheet corresponds to the heat conducting member.

The resulting laminate exhibited good appearance with no line of junction on the side of the design surface. The resulting laminate was also cut and separated into the area A, the area B, and the area C as shown in FIG. 11(b) by using an auto-cutting machine for evaluating the properties of each area. The results of the evaluation are shown in Table 2. The laminate had the radio wave permeable area, the heat conducting area, and the electromagnetic wave shielding area in its plane, and both the area A and the area C exhibited sufficiently good flexural modulus for serving as the rigidity retaining area.

Example 2

3 carbon fiber-reinforced sheets of material 3 were laminated at a fiber direction of 0°/90°/0° in this order to obtain the article to be molded. The resulting article to be molded was subjected to the hot press molding as in the case of the Example 1, and the mold was opened 30 minutes after applying the pressure. The molded article was taken out of the press molding machine together with the tool plates to obtain a carbon fiber reinforced plastic having the epoxy resin cured.

Next, the procedure of Example 1 was repeated except that the carbon fiber reinforced plastic obtained as described above was used instead of the aluminum sheet to produce the laminate having the constitution as shown in FIG. 11(a). It is to be noted that the glass fiber reinforced plastic corresponds to the radio wave permeable member, and the carbon fiber reinforced plastic corresponds to the rigidity retaining member.

The resulting laminate exhibited good appearance with no line of junction on the side of the design surface. The resulting laminate was also cut and separated into the area A, the area B, and the area C as shown in FIG. 11(b) by using an auto-cutting machine for evaluating the properties of each area. The results of the evaluation are shown in Table 2. The laminate had the radio wave permeable area and the electromagnetic wave shielding area in its plane despite the absence of the heat conducting area, and both the area A and the area C exhibited sufficiently good flexural modulus for serving as the rigidity retaining area.

Example 3

The aluminum sheet of material 2 was cut at the predetermined size. The carbon fiber reinforced plastic obtained in Example 2 was also cut at the predetermined size.

Figure 12:
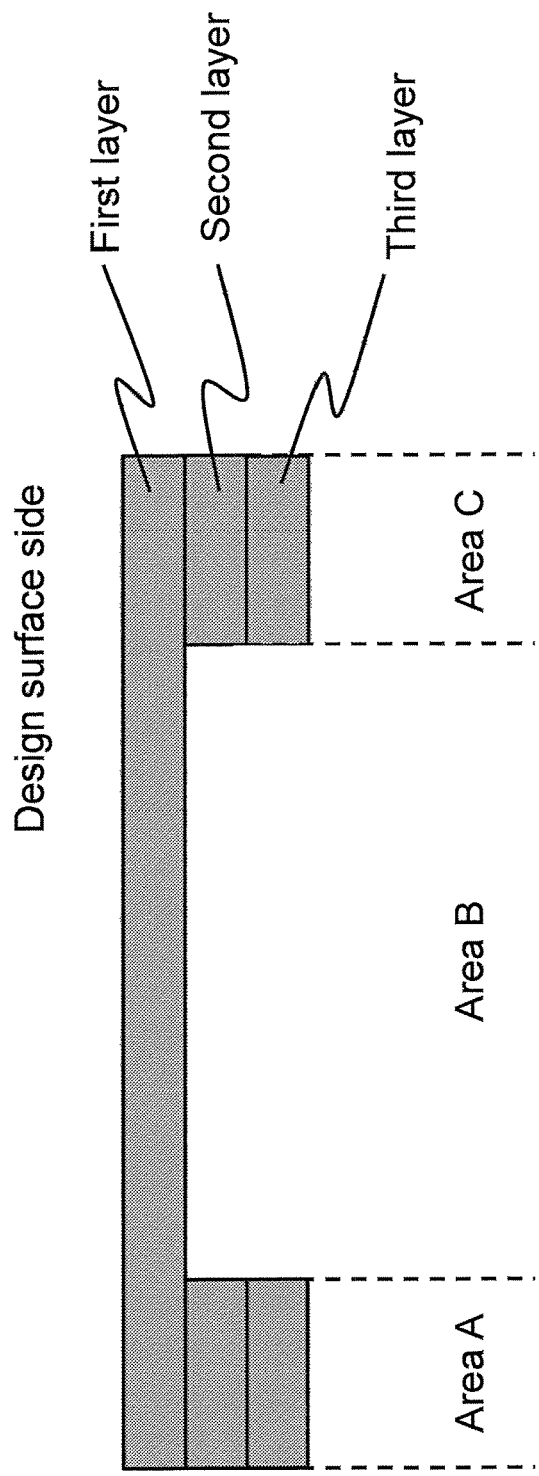
FIG. 12 is a cross sectional view showing an embodiment of the laminate of the present invention.

Next, as shown in FIG. 12, the carbon fiber reinforced plastic of predetermined size (the second layer) and the aluminum sheet of predetermined size (the third layer) were respectively placed on the area A and the area C of the glass fiber reinforced plastic (first layer) obtained in the Example 1, and layers were adhered by using an epoxy adhesive to thereby obtain a laminate. It is to be noted that the glass fiber reinforced plastic corresponds to the radio wave permeable member, the carbon fiber reinforced plastic corresponds to the rigidity retaining member and the aluminum sheet corresponds to the heat conducting member.

The resulting laminate exhibited good appearance with no line of junction on the side of the design surface. The resulting laminate was also cut and separated into the area A, the area B, and the area C as shown in FIG. 12 by using an auto-cutting machine for evaluating the properties of each area. The results of the evaluation are shown in Table 2. The laminate had the radio wave permeable area, the heat conducting area, and the electromagnetic wave shielding area in its plane, and both the area A and the area C exhibited sufficiently good flexural modulus for realizing the function of the rigidity retaining area.

Example 4

The aluminum sheet of material 2 was cut at the predetermined size. The carbon fiber reinforced plastic obtained in Example 2 was also cut at the predetermined size.

Figure 13:
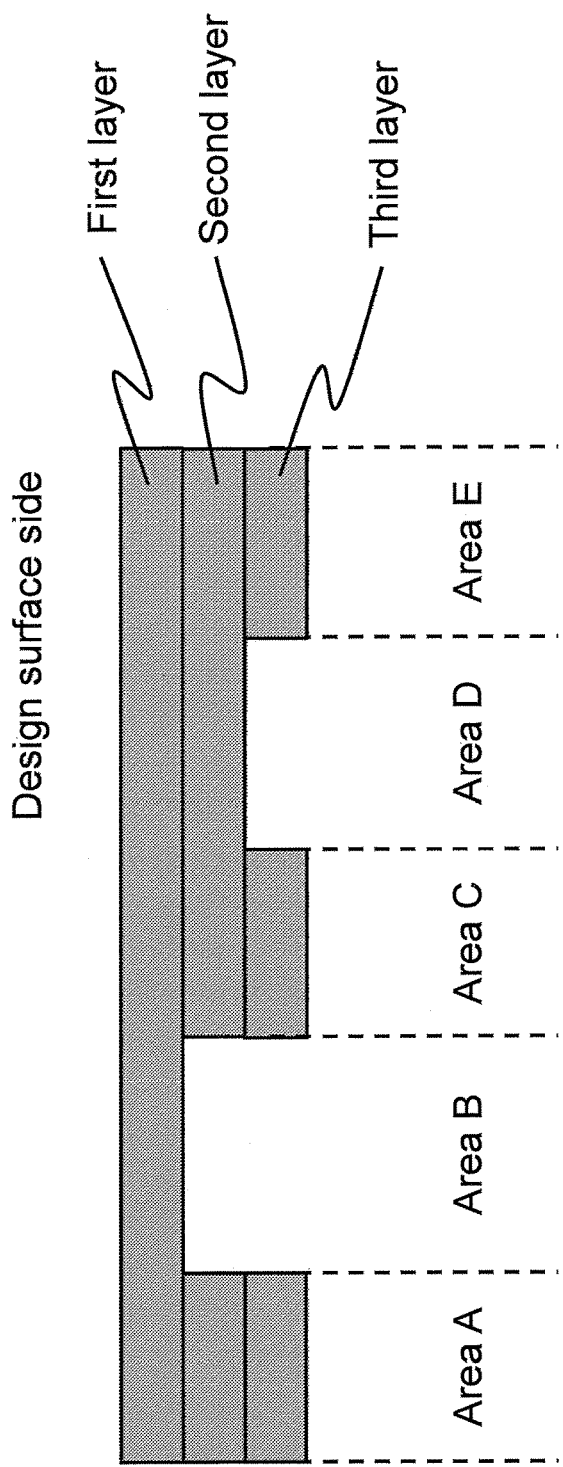
FIG. 13 is a cross sectional view showing another embodiment of the laminate of the present invention.

Next, as shown in FIG. 13, the aluminum sheet of predetermined size (the second layer) was placed only on the area A and the area C to the area E of the glass fiber reinforced plastic (first layer) obtained in the Example 1, the carbon fiber reinforced plastic sheet of predetermined size (the third layer) was further placed on the area A, the area C, and the area E, and layers were adhered by using an epoxy resin adhesive to thereby obtain a laminate. It is to be noted that the glass fiber reinforced plastic corresponds to the radio wave permeable member, carbon fiber reinforced plastic corresponds to the rigidity retaining member and the aluminum sheet corresponds to the heat conducting member.

The resulting laminate exhibited good appearance with no line of junction on the side of the design surface. The resulting laminate was also cut and separated into the area A, the area B, the area C, the area D, and the area E as shown in FIG. 13 by using an auto-cutting machine for evaluating the properties of each area. The results of the evaluation are shown in Table 2. The laminate had the radio wave permeable area, the heat conducting area, and the electromagnetic wave shielding area in its plane, and the area A, the area C, and the area E all exhibited sufficiently good flexural modulus for serving as the rigidity retaining area.

Example 5

3 glass fiber-reinforced sheets of the material 1 and 2 aluminum sheets of the material 2 were laminated in the order of the aluminum sheet/the glass fiber-reinforced sheet/the glass fiber-reinforced sheet/the glass fiber-reinforced sheet/the aluminum sheet to obtain the article to be molded.

Figure 14:
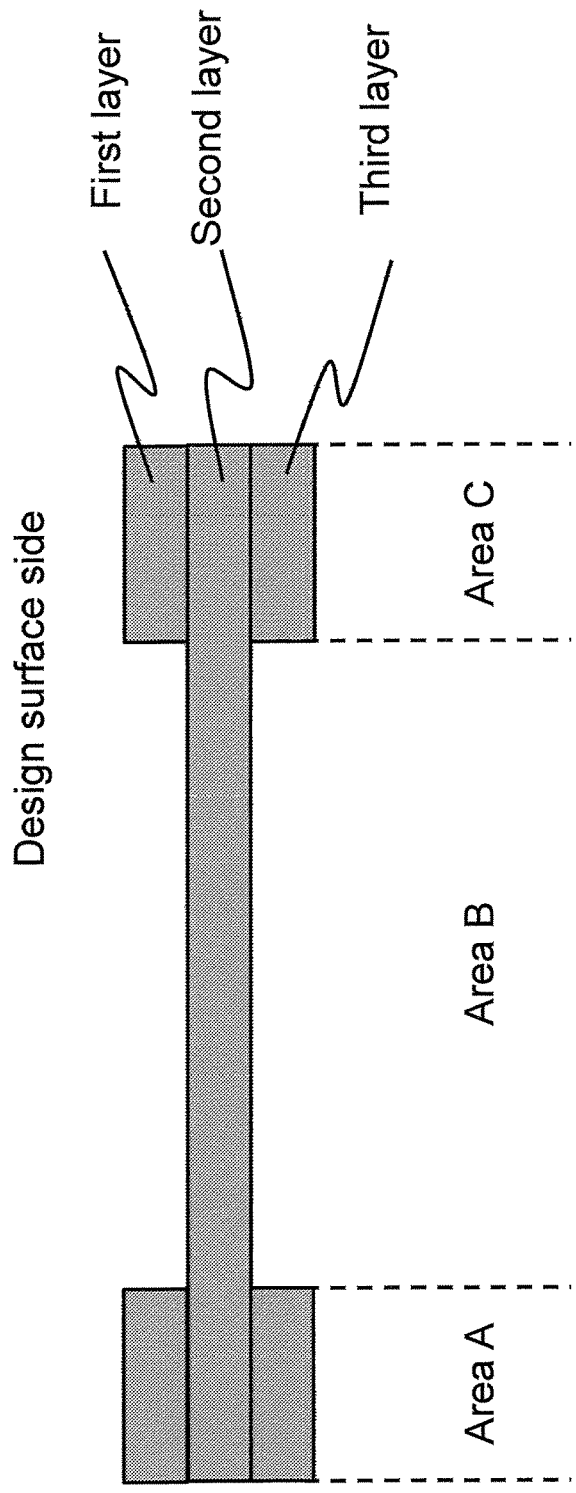
FIG. 14 is a cross sectional view showing a further embodiment of the laminate of the present invention.

The resulting article to be molded was subjected to the hot press molding as in the case of Example 1, and at 30 minutes after applying the pressure, the mold was opened and the molded article was taken out of the press molding machine together with the tool plates to obtain a preliminary laminate wherein the aluminum sheet/the glass fiber reinforced plastic/the aluminum sheet constituted the first to the third layers, and wherein the epoxy resin of the glass fiber-reinforced sheet had been cured and layers had been sufficiently adhered. Next, in the resulting preliminary laminate, the aluminum sheets of the preliminary laminate on the side of the design surface and the side of the interior side at the opposite side of the design surface were cut in the part corresponding to the area B in the resulting laminate by using a NC processing machine to produce a laminate as shown in FIG. 14 wherein the glass fiber reinforced plastic layer is solely left in the central part in the thickness direction in the area B. It is to be noted that, in FIG. 14, the aluminum sheets disposed as the first layer and the third layer correspond to the heat conducting members, and the glass fiber reinforced plastic disposed as the second layer corresponds to the radio wave permeable member.

The resulting laminate exhibited good appearance despite the provision of the recess on the side of the design surface. The resulting laminate was also cut and separated into the area A, the area B, and the area C as shown in FIG. 14 by using an auto-cutting machine for evaluating the properties of each area. The results of the evaluation are shown in Table 2. The laminate had the radio wave permeable area, the heat conducting area, and the electromagnetic wave shielding area in its plane, and the area A and the area C exhibited sufficiently good flexural modulus for serving as the rigidity retaining area.

Example 6

2 aluminum sheets of the material 2 and 1 polypropylene sheet of the material 4 were laminated in the order of the aluminum sheet/the polypropylene sheet/the aluminum sheet to obtain the article to be molded. The resulting article to be molded was subjected to the hot press molding as in the case of the Example 1 except that the plate temperature was changed to 180° C., and the tool plate with the article to be molded sandwiched therebetween was swiftly transferred to cold pressing machine to conduct cold press molding at a plate temperature of 80° C. and pressure of 1.5 MPa for 5 minutes, and the mold was opened. The molded article was taken out of the cold press molding machine together with the tool plates to obtain a preliminary laminate wherein layers had been sufficiently adhered.

Next, in the resulting preliminary laminate, the aluminum sheets of the preliminary laminate on the side of the design surface and the side of the interior side at the opposite side of the design surface were cut in the part corresponding to the area B in the resulting laminate by using a NC processing machine to produce a laminate as shown in FIG. 14 wherein the polypropylene sheet layer is solely left in the central part in the thickness direction in the area B. It is to be noted that, in FIG. 14, the aluminum sheets disposed as the first layer and the third layer correspond to the heat conducting members, and the polypropylene sheet disposed as the second layer corresponds to the low density member.

The resulting laminate exhibited good appearance despite the provision of the recess on the side of the design surface. The resulting laminate was also cut and separated into the area A, the area B, and the area C as shown in FIG. 14 by using an auto-cutting machine for evaluating the properties of each area. The results of the evaluation are shown in Table 2. The laminate had the radio wave permeable area, the heat conducting area, and the electromagnetic wave shielding area in its plane, and the area A and the area C exhibited good lightness as well as sufficient flexural modulus for serving as the rigidity retaining area.

TABLE 2

Figure 11:
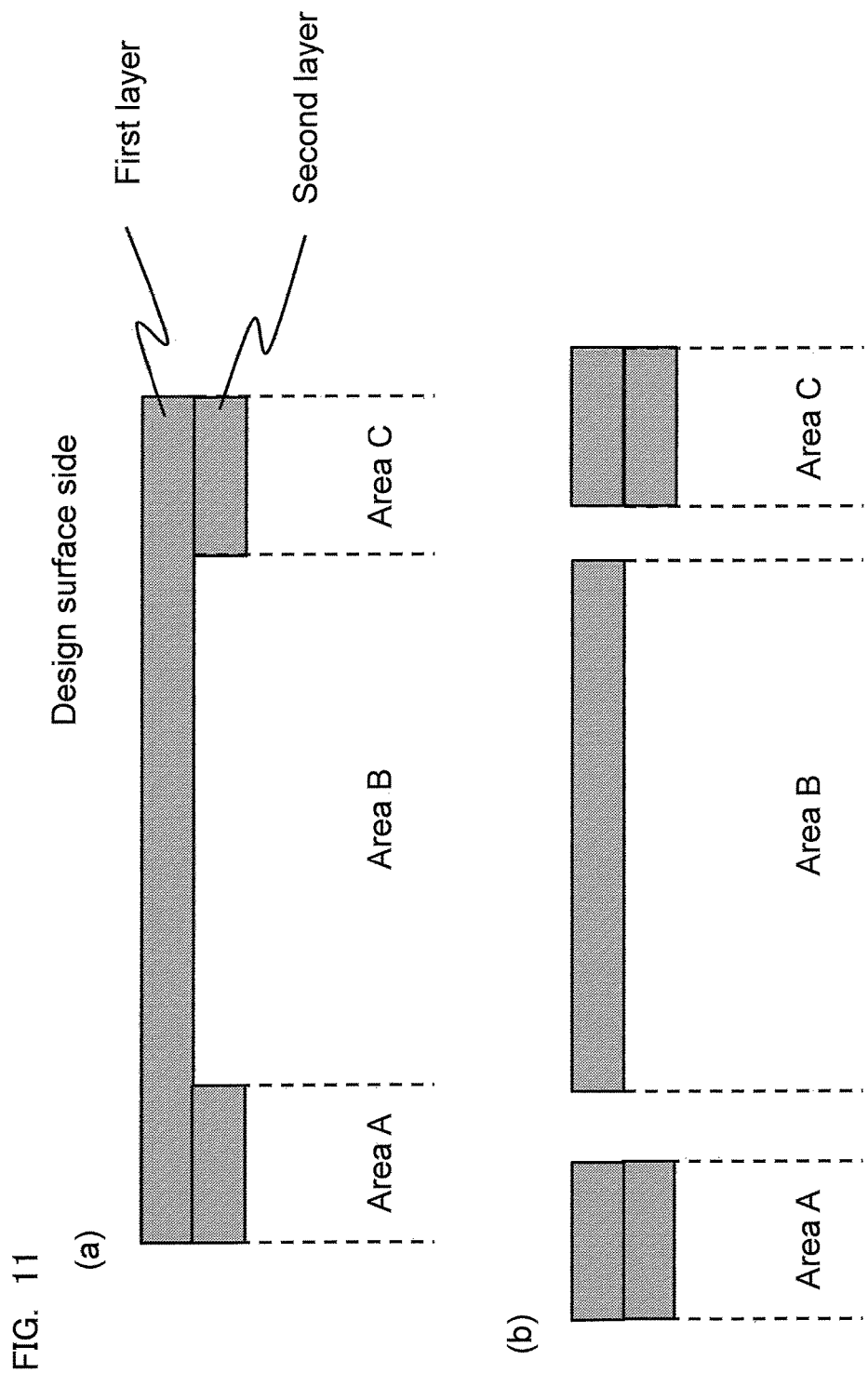

| | | | Example 1 | Example 2 | Example 3 | Example 4 | Example 5 | Example 6 |
|---|---|---|---|---|---|---|---|---|
| Laminate | Laminate constitution | First layer (design surface side) | Material 1 | Material 1 | Material 1 | Material 1 | Material 2 | Material 2 |
| | | Second layer | Material 2 | Material 3 | Material 3 | Material 2 | Material 1 | Material 4 |
| | | Third layer | — | — | Material 2 | Material 3 | Material 2 | Material 2 |
| | | Fourth layer | — | — | — | — | — | — |
| | | Fifth layer | — | — | — | — | — | — |
| | Cross section | | FIG. 11 | FIG. 11 | FIG. 12 | FIG. 13 | FIG. 14 | FIG. 14 |
| | Radio wave permeable area | | Area B in FIG. 11 | Area B in FIG. 11 | Area B in FIG. 12 | Area B in FIG. 13 | Area B in FIG. 14 | Area B in FIG. 14 |
| | Electromagnetic wave shielding area | | Areas A and C in FIG. 11 | Areas A and C in FIG. 11 | Areas A and C in FIG. 12 | Areas A, C, D, and E in FIG. 13 | Areas A and C in FIG. 14 | Areas A and C in FIG. 14 |
| | Heat conducting area | | Areas A and C in FIG. 11 | — | Areas A and C in FIG. 12 | Area D in FIG. 13 | Areas A and C in FIG. 14 | Areas A and C in FIG. 14 |
| | Rigidity-retaining area (Area comprising all members) | | Areas A and C in FIG. 11 | Areas A and C in FIG. 11 | Areas A and C in FIG. 12 | Areas A, C, and E in FIG. 13 | Areas A and C in FIG. 14 | Areas A and C in FIG. 14 |
| Properties of each area | Radio wave permeable area | Radio wave permeability | A | A | A | A | A | A |
| | Electro-magnetic wave shielding area | Electro-magnetic wave shielding property | A | A | A | A | A | A |
| | Heat conducting area | Heat dissipation property | A | — | A | A | A | A |

TABLE 2-continued

|  |  | Example 1 | Example 2 | Example 3 | Example 4 | Example 5 | Example 6 |
|---|---|---|---|---|---|---|---|
| Rigidity retaining area (Area comprising all members) | Flexural modulus | A | A | A | A | A | B |
|  | Electromagnetic wave shielding property | A | A | A | A | A | A |
|  | Lightness | B | B | B | B | B | A |
| Presence of the line of junction on design surface side | | No | No | No | No | Yes | Yes |

Example 7

4 glass fiber-reinforced sheets of the material 1, 4 carbon fiber-reinforced sheet of the material 3, and 1 polypropylene sheet of the material 4 were laminated in the order of the glass fiber-reinforced sheet/the glass fiber-reinforced sheet/the carbon fiber-reinforced sheet)(0°)/the carbon fiber-reinforced sheet)(90°)/the polypropylene sheet/the carbon fiber-reinforced sheet)(90°)/the carbon fiber-reinforced sheet)(0°)/the glass fiber-reinforced sheet/the glass fiber-reinforced sheet to obtain the article to be molded. The resulting article to be molded was subjected to hot press molding and cold press molding as in the case of the Example 6, and after opening the mold, the molded article was taken out of the cold pressing machine together with the tool plates to obtain a preliminary laminate having the glass fiber reinforced plastic/the carbon fiber reinforced plastic/the polypropylene sheet/the carbon fiber reinforced plastic/the glass fiber reinforced plastic for the first to the fifth layers wherein the epoxy resin of the glass fiber-reinforced sheets and the carbon fiber-reinforced sheet had been cured and layer had been sufficiently adhered.

Figure 15:
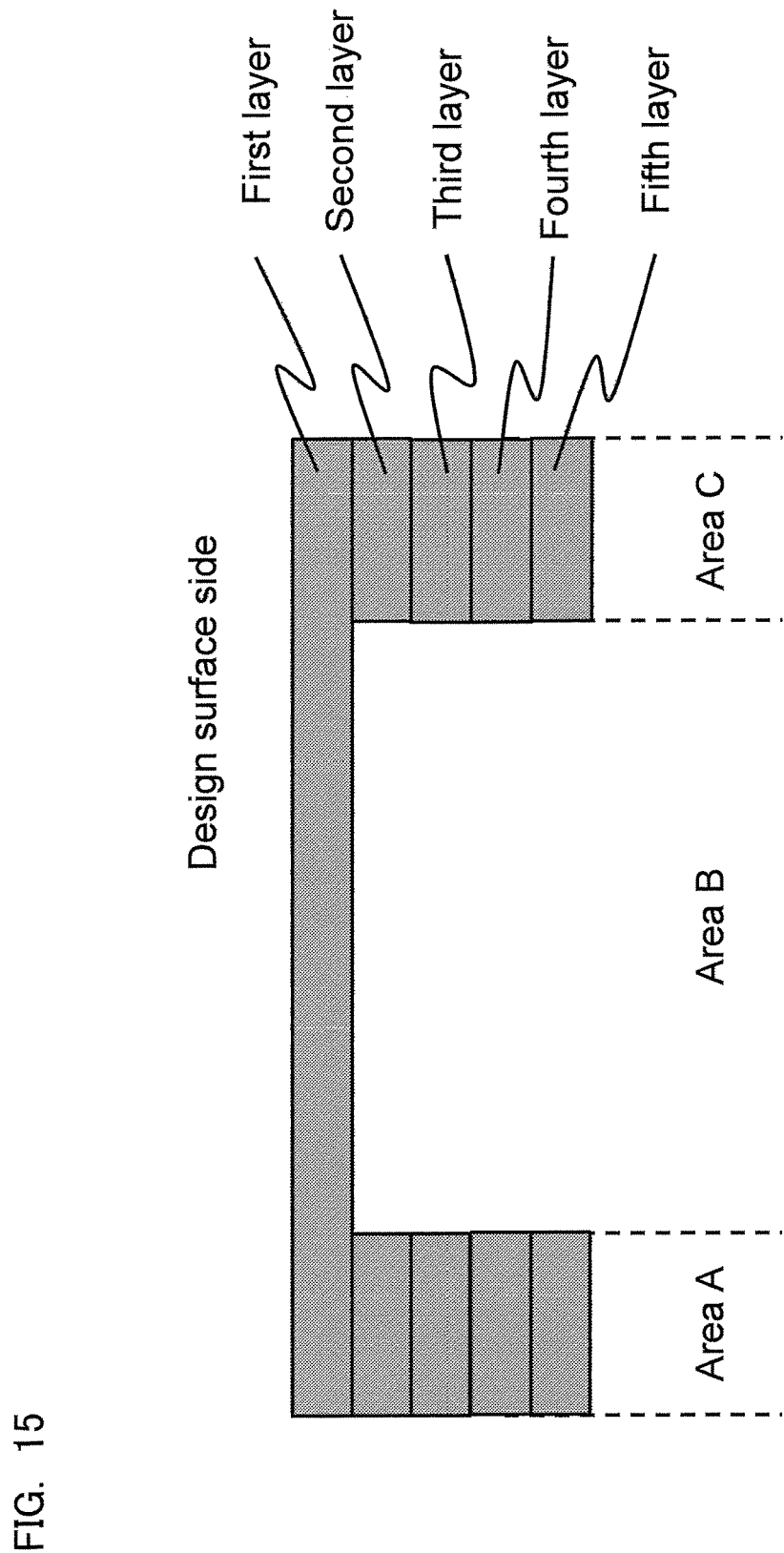
FIG. 15 is a cross sectional view showing a still further embodiment of the laminate of the present invention.

Next, in the resulting preliminary laminate, the carbon fiber reinforced plastic/the polypropylene sheet/the carbon fiber reinforced plastic/the glass fiber reinforced plastic of the preliminary laminate on the side of the interior surface at the side opposite to the design surface was cut in the part corresponding to the area B in the resulting laminate by using a NC processing machine to produce a laminate as shown in FIG. 15 wherein the glass fiber reinforced plastic disposed on the design surface in the thickness direction of the area B is solely left. It is to be noted that, in FIG. 15, the glass fiber reinforced plastics disposed as the first layer and the fifth layer correspond to the radio wave permeable members, the carbon fiber reinforced plastics disposed as the second layer and the fourth layer correspond to the rigidity retaining member having the electromagnetic wave shielding property, and the polypropylene sheet disposed as the third layer corresponds to the low density member.

The resulting laminate exhibited good appearance with no line of junction on the side of the design surface. The resulting laminate was also cut and separated into the area A, the area B, and the area C as shown in FIG. 15 by using an auto-cutting machine for evaluating the properties of each area. The results of the evaluation are shown in Table 3. The laminate had the radio wave permeable area and the electromagnetic wave shielding area in its plane despite the absence of the heat conducting area, and both the area A and the area C exhibited good flexural modulus as well as good lightness for serving the function as the rigidity retaining area.

Example 8

4 glass fiber-reinforced sheets of the material 1, 1 aluminum sheet of the material 2, and 4 carbon fiber-reinforced sheet s of the material 3 were laminated in the order of the glass fiber-reinforced sheet/the glass fiber-reinforced sheet/the carbon fiber-reinforced sheet)(0°)/the carbon fiber-reinforced sheet)(90°)/the aluminum sheet/the carbon fiber-reinforced sheet)(90°)/the carbon fiber-reinforced sheet)(0°)/the glass fiber-reinforced sheet/the glass fiber-reinforced sheet to obtain the article to be molded. The resulting article to be molded was subjected to the hot press molding as in the case of the Example 1, and the mold was opened 30 minutes after applying the pressure. The molded article was taken out of the press molding machine together with the tool plates to obtain a preliminary laminate having the glass fiber reinforced plastic/the carbon fiber reinforced plastic/the aluminum sheet/the carbon fiber reinforced plastic/the glass fiber reinforced plastic for the first to the fifth layer, and wherein the glass fiber-reinforced sheet and the epoxy resin in the carbon fiber-reinforced sheet had been cured and the layers had been sufficiently adhered.

Figure 16:
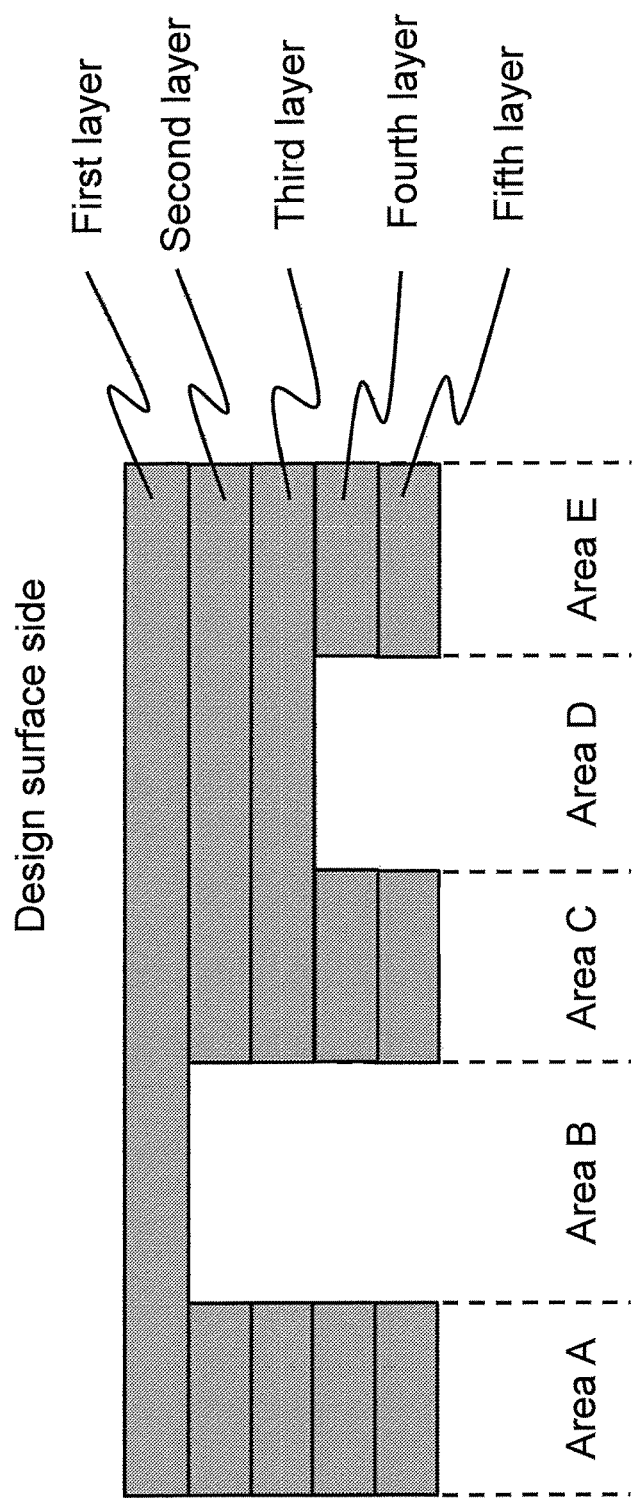
FIG. 16 is a cross sectional view showing a still further embodiment of the laminate of the present invention.

Next, in the resulting preliminary laminate, the carbon fiber reinforced plastic/the aluminum sheet/the carbon fiber reinforced plastic/the glass fiber reinforced plastic of the preliminary laminate on the side of the interior surface at the side opposite to the design surface was cut in the part corresponding to the area B of the resulting laminate by using a NC processing machine to solely leave the glass fiber reinforced plastic disposed on the design surface in the thickness direction of the area B. In addition, the carbon fiber reinforced plastic/the glass fiber reinforced plastic in the part corresponding to the area D of the resulting laminate on the side of the interior surface was cut by using a NC processing machine to produce a laminate having the aluminum sheet exposed on the side of the interior surface in the thickness direction of the area D as shown in FIG. 16. It is to be noted that, in FIG. 16, the glass fiber reinforced plastics used as the first layer and the fifth layer correspond to the radio wave permeable members, the aluminum sheet disposed as the third layer corresponds to the heat conducting member, and the carbon fiber reinforced plastics disposed as the second layer and the fourth layer correspond to the rigidity retaining members.

The resulting laminate exhibited good appearance with no line of junction on the side of the design surface. The resulting laminate was also cut and separated into the area A, the area B, the area C, the area D, and the area E as shown in FIG. 16 by using an auto-cutting machine for evaluating the properties of each area. The results of the evaluation are shown in Table 3. The laminate had the radio wave permeable area, the heat conducting area, and the electromagnetic wave shielding area in its plane, and the area A, the area C, and the area E exhibited sufficiently good flexural modulus for serving as the rigidity retaining area.

Example 9

1 sheet of the glass fiber reinforced plastic obtained in Example 1, 1 aluminum sheet of material 2, 4 carbon fiber-reinforced sheets of material 3, and 1 polypropylene sheet of material 4 were used.

First, 4 carbon fiber-reinforced sheets of the material 3 and 1 polypropylene sheet of the material 4 were laminated in the order of the carbon fiber-reinforced sheet)(0°)/the carbon fiber-reinforced sheet)(90°)/the polypropylene sheet/ the carbon fiber-reinforced sheet)(90°)/the carbon fiber-reinforced sheet (0°) to obtain the article to be molded. The resulting article to be molded was subjected to the hot press molding and cold press molding as in the case of Example 6, and the mold was opened and the molded article was taken out of the cold press molding machine together with the tool plates to obtain a sandwich structure having the constitution of the carbon fiber reinforced plastic/the polypropylene sheet/the carbon fiber reinforced plastic, wherein the epoxy resin of the carbon fiber-reinforced sheet had been cured and layers had been sufficiently adhered.

Figure 17:
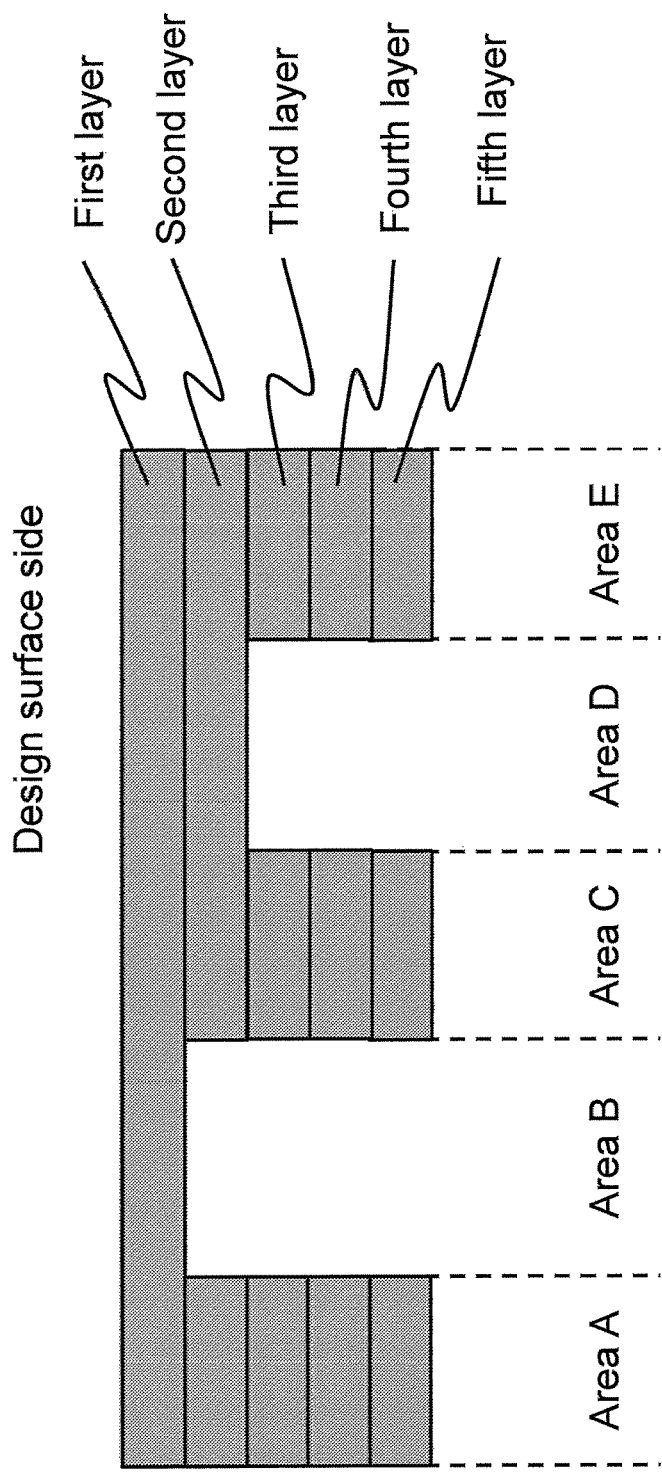
FIG. 17 is a cross sectional view showing a still further embodiment of the laminate of the present invention.

Next, in the sandwich structure, a notch extending through the thickness direction of the sandwich structure was formed in the area of area D of the resulting laminate by using a NC processing machine. This sandwich structure formed with the notch was adhered with an aluminum sheet by using an epoxy adhesive, and a notch extending through the thickness direction was also formed in the area of area B of the resulting laminate to produce a preliminary laminate. By using an epoxy adhesive, the glass fiber reinforced plastic obtained in the Example 1 was adhered to the resulting preliminary laminate (the sandwich structure/the aluminum sheet) on the side of the aluminum sheet to thereby produce a laminate as shown in FIG. 17, and in this laminate, the radio wave permeable area with the glass fiber reinforced plastic layer solely left on the design surface was provided in the area B, and the heat conducting area with the aluminum sheet exposed on the side of the interior surface was provided in the area D. In FIG. 17, the glass fiber reinforced plastic disposed as the first layer corresponds to the radio wave permeable member, the aluminum sheet disposed for the second layer corresponds to the heat conducting member, the carbon fiber reinforced plastics disposed as the third layer and the fifth layer correspond to the rigidity retaining members, and the polypropylene sheet disposed for the fourth layer corresponds to the low density member. In addition, in FIG. 17, the area B serves the radio wave permeable area (the thin area), and the area D serves the heat conducting area (the thin area).

The resulting laminate exhibited good appearance with no line of junction on the side of the design surface. The resulting laminate was also cut and separated into the area A, the area B, the area C, the area D, and the area E as shown in FIG. 17 by using an auto-cutting machine for evaluating the properties of each area. The results of the evaluation are shown in Table 3. The laminate had the radio wave permeable area, the heat conducting area, and the electromagnetic wave shielding area in its plane, and the area A, the area C, and the area E exhibited good flexural modulus as well as good lightness for serving the function of the rigidity retaining area.

Example 10

4 glass fiber-reinforced sheets of the material 1, 2 aluminum sheets of the material 2, 4 carbon fiber-reinforced sheets of the material 3, and 1 polypropylene sheet of the material 4 were laminated in the order of the glass fiber-reinforced sheet/the glass fiber-reinforced sheet/the aluminum sheet/the carbon fiber-reinforced sheet)(0°)/the carbon fiber-reinforced sheet)(90°)/the polypropylene sheet/the carbon fiber-reinforced sheet)(90°)/the carbon fiber-reinforced sheet)(0°)/the aluminum sheet/the glass fiber-reinforced sheet/the glass fiber-reinforced sheet to obtain the article to be molded. The resulting article to be molded was subjected to the hot press molding and cold press molding as in the case of Example 6, and the mold was opened and the molded article was taken out of the cold press molding machine together with the tool plates to obtain a preliminary laminate having the glass fiber reinforced plastic/the aluminum sheet/ the carbon fiber reinforced plastic/the polypropylene sheet/ the carbon fiber reinforced plastic/the aluminum sheet/the glass fiber reinforced plastic for the first to the seventh layer, wherein the epoxy resin of the glass fiber-reinforced sheet and the carbon fiber-reinforced sheet had been cured and layers had been sufficiently adhered.

Figure 18:
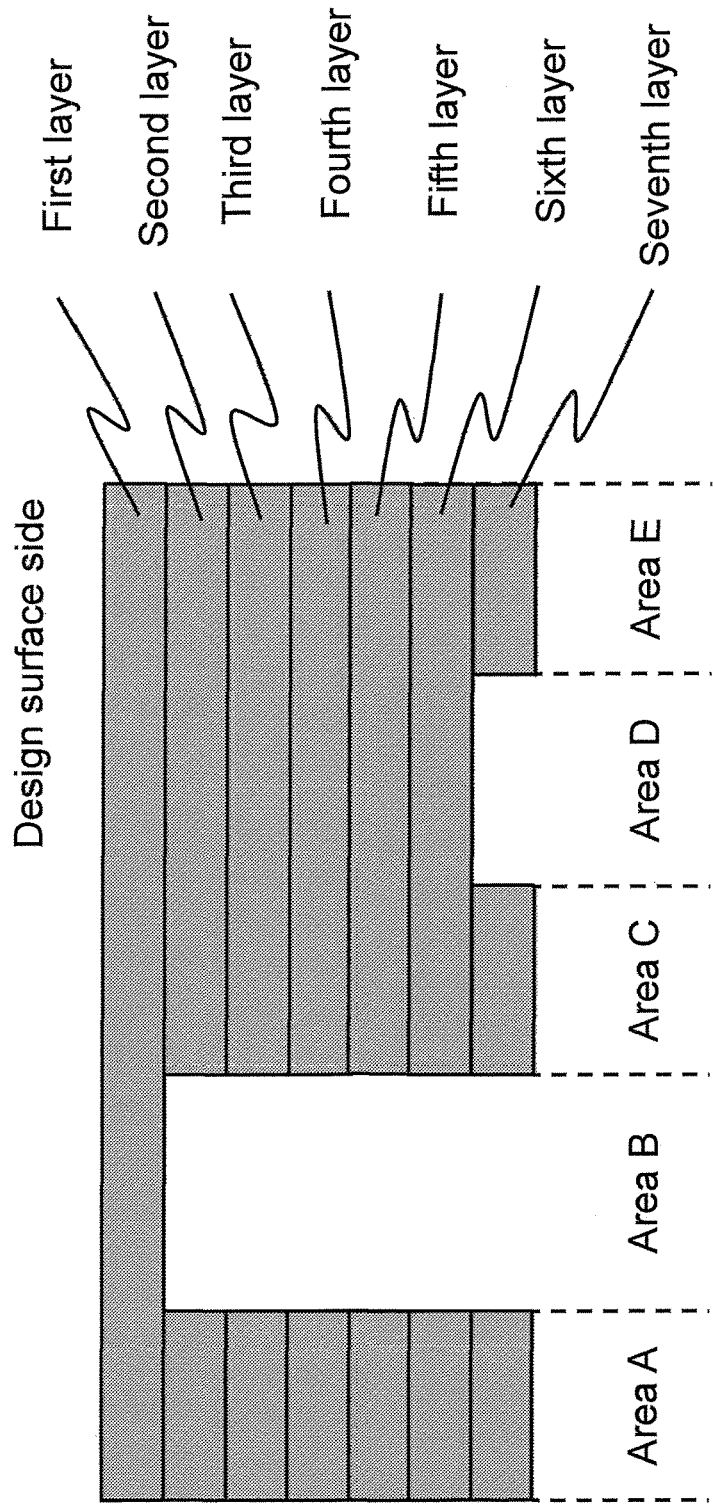
FIG. 18 is a cross sectional view showing a still further embodiment of the laminate of the present invention.

Next, in the resulting preliminary laminate, the aluminum sheet/the carbon fiber reinforced plastic/the polypropylene sheet/the carbon fiber reinforced plastic/the aluminum sheet/ the glass fiber reinforced plastic of the preliminary laminate on the side of the interior surface at the side opposite to the design surface was cut in the part corresponding to the area B of the resulting laminate by using a NC processing machine to solely leave the glass fiber reinforced plastic disposed on the design surface in the thickness direction of the area B. In addition, the glass fiber reinforced plastic in the part corresponding to the area D of the resulting laminate on the side of the interior surface was cut by using a NC processing machine to produce a laminate having the aluminum sheet of the sixth layer exposed on the side of the interior surface in the thickness direction of the area D as shown in FIG. 18. It is to be noted that, in FIG. 18, the glass fiber reinforced plastics disposed as the first layer and the seventh layer correspond to the radio wave permeable members, the aluminum sheets disposed as the second layer and the sixth layer correspond to the heat conducting members having the electromagnetic wave shielding property, the carbon fiber reinforced plastics disposed for the third layer and the fifth layer correspond to the rigidity retaining members having the electromagnetic wave shielding property, and the polypropylene sheet disposed for the fourth layer corresponds to the low density member.

The resulting laminate exhibited good appearance with no line of junction on the side of the design surface. The resulting laminate was also cut and separated into the area A, the area B, the area C, the area D, and the area E as shown in FIG. 18 by using an auto-cutting machine for evaluating the properties of each area. The results of the evaluation are shown in Table 3. The laminate had the radio wave permeable area, the heat conducting area, and the electromagnetic wave shielding area in its plane, and the rigidity retaining area exhibited good flexural modulus.

Example 11

Figure 19:
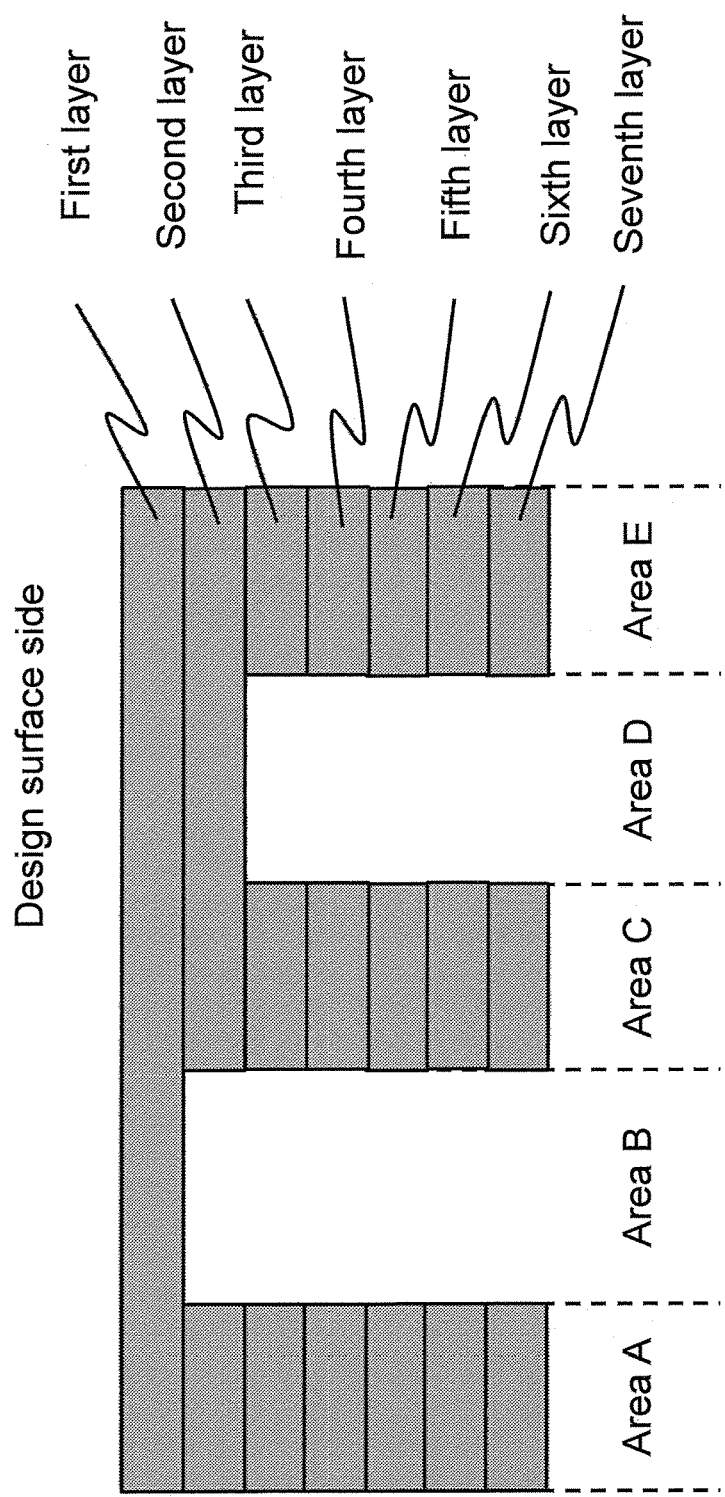
FIG. 19 is a cross sectional view showing a still further embodiment of the laminate of the present invention.

Next, in the preliminary laminate obtained in the Example 10, the aluminum sheet/the carbon fiber reinforced plastic/ the polypropylene sheet/the carbon fiber reinforced plastic/ the aluminum sheet/the glass fiber reinforced plastic of the preliminary laminate on the side of the interior surface at the side opposite to the design surface was cut in the part corresponding to the area B of the resulting laminate by using a NC processing machine to solely leave the glass fiber reinforced plastic disposed on the side of the design surface in the thickness direction of the area B. In addition, the carbon fiber reinforced plastic/the polypropylene sheet/the carbon fiber reinforced plastic/the aluminum sheet/the glass fiber reinforced plastic in the part corresponding to the area D of the resulting laminate on the side of the interior surface was cut by using a NC processing machine to produce a laminate having the aluminum sheet of the second layer exposed on the side of the interior surface in the thickness direction of the area D as shown in FIG. 19.

The resulting laminate exhibited good appearance with no line of junction on the side of the design surface. The resulting laminate was also cut and separated into the area A, the area B, the area C, the area D, and the area E as shown in FIG. 19 by using an auto-cutting machine for evaluating the properties of each area. The results of the evaluation are shown in Table 3. The laminate had the radio wave permeable area, the heat conducting area, and the electromagnetic wave shielding area in its plane, and the area A, the area C, and the area E exhibited sufficiently good flexural modulus for serving as the rigidity retaining area. The laminate obtained in this Example has the thickness of the heat conducting area thinner than that of the laminate obtained in Example 10, and this enables reduction of the entire thickness after mounting heat-generating parts such as CPU.

inferior electromagnetic wave shielding property, and the laminate also exhibited an inferior flexural modulus.

Comparative Example 2

Figure 20:
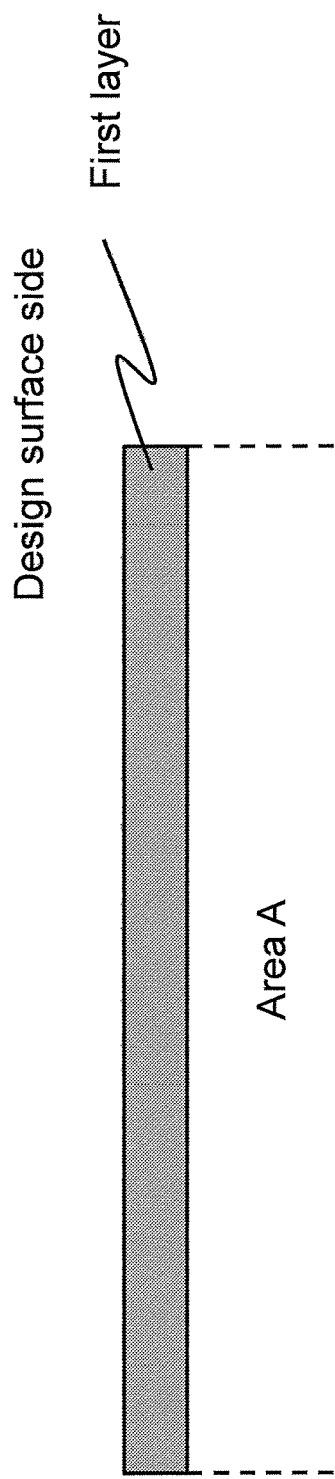
FIG. 20 is a cross sectional view showing the laminate used in the Comparative Example.

A laminate solely comprising the first layer as shown in FIG. 20 was produced by adhering 2 aluminum sheets of the material 2 by using an epoxy adhesive. The aluminum sheet of the laminate corresponds to the heat conducting member having the electromagnetic wave shielding property.

The resulting laminate exhibited good appearance with no line of junction on the side of the design surface. The resulting laminate was evaluated for its properties, and the results are shown in Table 4. Although this laminate had the electromagnetic wave shielding area and the heat conducting area, the radio wave permeable area was absent in the laminate. The laminate exhibited inferior lightness despite the good flexural modulus.

TABLE 3

| | | | Example 7 | Example 8 | Example 9 | Example 10 | Example 11 |
|---|---|---|---|---|---|---|---|
| Laminate | Laminate constitution | First layer (design surface side) | Material 1 | Material 1 | Material 1 | Material 1 | Material 1 |
| | | Second layer | Material 3 | Material 3 | Material 2 | Material 2 | Material 2 |
| | | Third layer | Material 4 | Material 2 | Material 3 | Material 3 | Material 3 |
| | | Fourth layer | Material 3 | Material 3 | Material 4 | Material 4 | Material 4 |
| | | Fifth layer | Material 1 | Material 1 | Material 3 | Material 3 | Material 3 |
| | | Sixth layer | — | — | — | Material 2 | Material 2 |
| | | Seventh layer | — | — | — | Material 1 | Material 1 |
| | Cross section | | FIG. 15 | FIG. 16 | FIG. 17 | FIG. 18 | FIG. 19 |
| | Radio wave permeable area | | Area B in FIG. 15 | Area B in FIG. 16 | Area B in FIG. 17 | Area B in FIG. 18 | Area B in FIG. 19 |
| | Electromagnetic wave-shielding are | | Areas A and C of FIG. 15 | Areas A, C, D and E in FIG. 16 | Areas A, C, D, and E in FIG. 17 | Areas A, C, D, and E in FIG. 18 | Areas A, C, D, and E in FIG. 19 |
| | Heat conducting area | | — | Area D in FIG. 16 | Area D in FIG. 17 | Area D in FIG. 18 | Area D in FIG. 19 |
| | Rigidity-retaining area (Area comprising all members) | | Areas A and C of FIG. 15 | Area A, C, and E in FIG. 16 | Area A, C, and E in FIG. 17 | Area A, C, and E in FIG. 18 | Area A, C, and E in FIG. 19 |
| Properties of each area | Radio wave permeable area | Radio wave permeability | A | A | A | A | A |
| | Electromagnetic wave shielding area | Electromagnetic wave shielding property | A | A | A | A | A |
| | Heat conducting area | Heat dissipation property | — | A | A | A | A |
| | Rigidity retaining area (Area comprising all members) | Flexural modulus | A | A | A | A | A |
| | | Electromagnetic wave shielding property | A | A | A | A | A |
| | | Lightness | A | B | A | B | B |
| Presence of the line of junction on design surface side | | | No | No | No | No | No |

Comparative Example 1

A laminate solely comprising the first layer as shown in FIG. 20 was produced by using the glass fiber reinforced plastic obtained in the Example 1 for the radio wave permeable member.

The resulting laminate exhibited good appearance with no line of junction on the side of the design surface. The resulting laminate was evaluated for its properties, and the results are shown in Table 4. Although this laminate had the radio wave permeable area, the laminate exhibited quite Comparative Example 3

A laminate solely comprising the first layer as shown in FIG. 20 was produced by using the carbon fiber reinforced plastic obtained in the Example 2 for the rigidity retaining member having the electromagnetic wave shielding property.

The resulting laminate exhibited good appearance with no line of junction on the side of the design surface. The resulting laminate was evaluated for its properties, and the results are shown in Table 4. The resulting laminate had the electromagnetic wave shielding area but not the radio wave permeable area or the heat conducting member. The laminate exhibited good flexural modulus as well as good lightness.

Comparative Example 4

A laminate solely comprising the first layer as shown in FIG. 20 was produced by adhering 2 polypropylene sheets of the material 4 using an epoxy adhesive. The polypropylene sheet of the laminate corresponds to the radio wave permeable member having the radio wave permeability.

The resulting laminate exhibited good appearance with no line of junction on the side of the design surface. The resulting laminate was evaluated for its properties, and the results are shown in Table 4. The resulting laminate had the radio wave permeable area but the electromagnetic wave shielding property was quite inferior. The laminate exhibited excellent lightness but quite inferior flexural modulus.

Comparative Example 5

The procedure of Example 1 was repeated except that the glass fiber reinforced plastic of the first layer was replaced with the carbon fiber reinforced plastic obtained in the Example 2 to produce the laminate shown in FIG. 11(a). It is to be noted that the carbon fiber reinforced plastic corresponds to the rigidity retaining member having the electromagnetic wave shielding property and the aluminum sheet corresponds to the heat conducting member having the electromagnetic wave shielding property.

The resulting laminate exhibited good appearance with no line of junction on the side of the design surface. The resulting laminate was also cut and separated into the area A, the area B, and the area C as shown in FIG. 11(b) by using an auto-cutting machine for evaluating the properties of each area. The results of the evaluation are shown in Table 4. The laminate had the heat conducting area and the electromagnetic wave shielding area in the plane despite the absence of the radio wave permeable area, and the area A and the area C exhibited excellent flexural modulus with the function as the rigidity retaining area.

Comparative Example 6

1 aluminum sheet of the material 2 and 4 carbon fiber-reinforced sheets of the material 3 were laminated in the order of the carbon fiber-reinforced sheet)(0°)/the carbon fiber-reinforced sheet)(90°)/the aluminum sheet/the carbon fiber-reinforced sheet)(90°)/the carbon fiber-reinforced sheet (0°) and subjected to the hot press molding as in the case of Example 1. The mold was opened at 30 minutes after the molding and the molded article was taken out of the press molding machine together with the tool plates to obtain a preliminary laminate having the carbon fiber reinforced plastic/the aluminum sheet/the carbon fiber reinforced plastic for the first to the third layer, wherein the epoxy resin of the carbon fiber-reinforced sheet had been cured, and layers had been sufficiently adhered.

Figure 21:
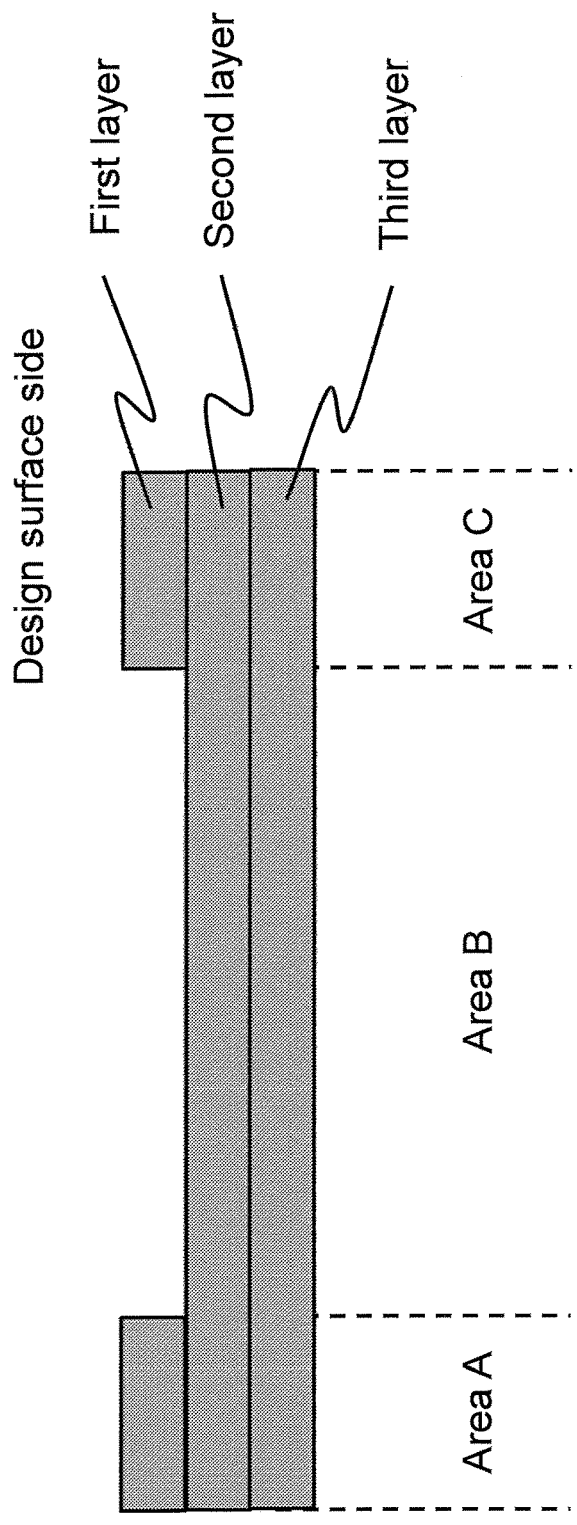
FIG. 21 is a cross sectional view showing the laminate used in the Comparative Example.

Next, in the resulting preliminary laminate, the carbon fiber reinforced plastic of the part corresponding to the area B of the resulting laminate on the side of the design surface was cut to produce the laminate shown in FIG. 21 having only the aluminum sheet/the carbon fiber-reinforced sheet left in the thickness direction in the area B. It is to be noted that, in FIG. 21, the carbon fiber reinforced plastics disposed as the first layer and the third layer correspond to the rigidity retaining members having the electromagnetic wave shielding property, and the aluminum sheet disposed as the second layer corresponds to the heat conducting member having the electromagnetic wave shielding property.

The resulting laminate exhibited good appearance despite the provision of the recess on the side of the design surface. The resulting laminate was also cut and separated into the area A, the area B, and the area C as shown in FIG. 21 by using an auto-cutting machine for evaluating the properties of each area. The results of the evaluation are shown in Table 4. The resulting laminate had the heat conducting area and the electromagnetic wave shielding area in its plane despite the absence of the radio wave permeable area, and the area A and the area C exhibited sufficient flexural modulus for serving the function of the rigidity retaining area.

Comparative Example 7

Figure 22:
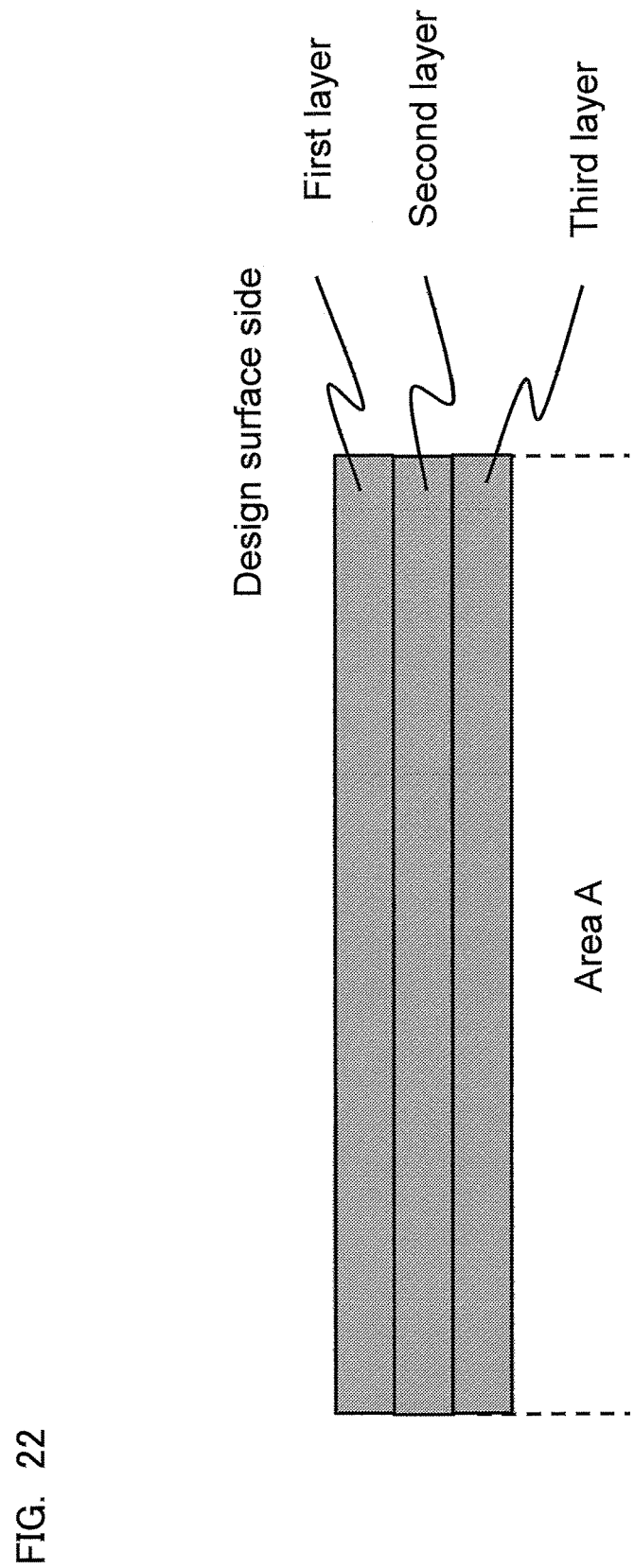
FIG. 22 is a cross sectional view showing the laminate used in the Comparative Example.

4 glass fiber-reinforced sheets of the material 1 and 1 polypropylene sheet of the material 4 were laminated in the order of the glass fiber-reinforced sheet/the glass fiber-reinforced sheet/the polypropylene sheet/the glass fiber-reinforced sheet/the glass fiber-reinforced sheet and subjected to the hot press molding and cold press molding as in the case of Example 6. The mold was opened and the molded article was taken out of the cold press molding machine together with the tool plates to obtain a laminate having the glass fiber reinforced plastic/the polypropylene sheet/the glass fiber reinforced plastic for the first to the third layer as shown in FIG. 22, wherein the epoxy resin of the glass fiber-reinforced sheet had been cured, and layers had been sufficiently adhered. It is to be noted that, in FIG. 22, the glass fiber reinforced plastics disposed as the first layer and the third layer correspond to radio wave permeable members, and the polypropylene sheet disposed as the second layer corresponds to the low density member.

The resulting laminate exhibited good appearance with no line of junction on the side of the design surface. The resulting laminate was evaluated for its properties, and the results are shown in Table 4. The resulting laminate had the radio wave permeable area but the electromagnetic wave shielding property was quite inferior. The laminate exhibited excellent lightness but quite inferior flexural modulus.

Comparative Example 8

4 carbon fiber-reinforced sheets of the material 3 and 1 polypropylene sheet of the material 4 were laminated in the order of the carbon fiber-reinforced sheet)(0°)/the carbon fiber-reinforced sheet)(90°)/the polypropylene sheet/the carbon fiber-reinforced sheet)(90°)/the carbon fiber-reinforced sheet (0°) and subjected to the hot press molding and cold press molding as in the case of Example 6. The mold was opened and the molded article was taken out of the cold press molding machine together with the tool plates to obtain a laminate having the carbon fiber reinforced plastic/the polypropylene sheet/the carbon fiber reinforced plastic for the first to the third layer as shown in FIG. 22, wherein the epoxy resin of the carbon fiber-reinforced sheet had been cured, and layers had been sufficiently adhered. It is to be noted that the carbon fiber reinforced plastics disposed as the first layer and the third layer in FIG. 22 correspond to rigidity retaining members having the electromagnetic wave shielding property, and the polypropylene sheet disposed as the second layer corresponds to the low density member.

The resulting laminate exhibited good appearance with no line of junction on the side of the design surface. The resulting laminate was evaluated for its properties, and the results are shown in Table 4. The resulting laminate had the electromagnetic wave shielding area but not the radio wave permeable area or the heat conducting area. The laminate exhibited good flexural modulus as well as good lightness.

Comparative Example 9

Figure 23:
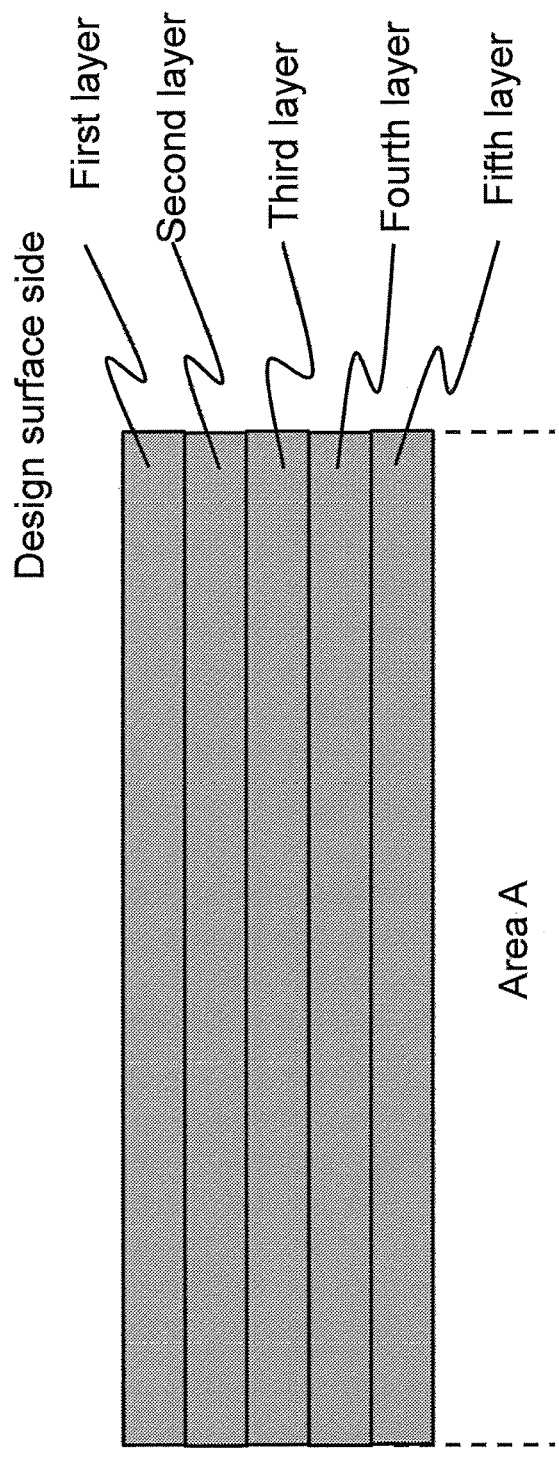
FIG. 23 is a cross sectional view showing the laminate used in the Comparative Example.

The preliminary laminate obtained in the Example 8 was used with no further processing to obtain the laminate as shown in FIG. 23. It is to be noted that, in FIG. 23, the glass fiber reinforced plastics disposed as the first layer and the fifth layer correspond to the radio wave permeable members, the carbon fiber reinforced plastic disposed as the second layer and the fourth layer corresponds to the rigidity retaining member having the electromagnetic wave shielding property, and the aluminum sheet disposed for the third layer corresponds to heat conducting member having the electromagnetic wave shielding property.

The resulting laminate exhibited good appearance with no line of junction on the side of the design surface. The resulting laminate was evaluated for its properties, and the results are shown in Table 4. The resulting laminate had the electromagnetic wave shielding area but not the radio wave permeable area or the heat conducting area.

TABLE 4

| | | | | Comp. Ex. 1 | Comp. Ex. 2 | Comp. Ex. 3 | Comp. Ex. 4 | Comp. Ex. 5 |
|---|---|---|---|---|---|---|---|---|
| Laminate | Laminate constitution | First layer (design surface side) | | Material 1 | Material 2 | Material 3 | Material 4 | Material 2 |
| | | Second layer | | — | — | — | — | Material 3 |
| | | Third layer | | — | — | — | — | — |
| | | Fourth layer | | — | — | — | — | — |
| | | Fifth layer | | — | — | — | — | — |
| | Cross section | | | FIG. 20 | FIG. 20 | FIG. 20 | FIG. 20 | FIG. 11 |
| | Radio wave permeable area | | | Area A in FIG. 20 | — | — | Area A in FIG. 20 | — |
| | Electromagnetic wave-shielding area | | | — | Area A in FIG. 20 | Area A in FIG. 20 | — | Areas A, B, and C in FIG. 11 |
| | Heat conducting area | | | — | Area A in FIG. 20 | — | — | Area B in FIG. 11 |
| | Area comprising all members | | | Area A in FIG. 20 | Area A in FIG. 20 | Area A in FIG. 20 | Area A in FIG. 20 | Areas A and C in FIG. 11 |
| | Properties of each area | Radio wave permeable area | Radio wave permeability | A | — | — | A | — |
| | | Electromagnetic wave-shielding area | Electromagnetic wave-shielding property | — | A | A | — | A |
| | | Heat conducting area | Heat dissipation property | — | A | — | — | A |
| | | Area comprising all members | Flexural modulus | C | A | A | D | AA |
| | | | Electromagnetic wave-shielding property | C | A | A | C | A |
| | | | Lightness | B | D | A | AA | B |
| Presence of the line of junction on design surface side | | | | No | No | No | No | No |

| | | | | Comp. Ex. 6 | Comp. Ex. 7 | Comp. Ex. 8 | Comp. Ex. 9 |
|---|---|---|---|---|---|---|---|
| Laminate | Laminate constitution | First layer (design surface side) | | Material 3 | Material 1 | Material 3 | Material 1 |
| | | Second layer | | Material 2 | Material 4 | Material 4 | Material 3 |
| | | Third layer | | Material 3 | Material 1 | Material 3 | Material 2 |
| | | Fourth layer | | — | — | — | Material 3 |
| | | Fifth layer | | — | — | — | Material 1 |
| | Cross section | | | FIG. 21 | FIG. 22 | FIG. 22 | FIG. 23 |
| | Radio wave permeable area | | | — | Area A in FIG. 22 | — | — |
| | Electromagnetic wave-shielding area | | | Areas A, B, and C in FIG. 21 | — | Area A in FIG. 22 | Area A in FIG. 23A |
| | Heat conducting area | | | Areas A and C in FIG. 21 | — | — | — |
| | Area comprising all members | | | Areas A and C in FIG. 21 | Area A in FIG. 22 | Area A in FIG. 22 | Area A in FIG. 23 |
| | Properties of each area | Radio wave permeable area | Radio wave permeability | — | A | — | — |
| | | Electromagnetic wave-shielding area | Electromagnetic wave-shielding property | A | — | A | A |

TABLE 4-continued

| | | | | | |
|---|---|---|---|---|---|
| Heat conducting area | Heat dissipation property | A | — | — | — |
| Area comprising all members | Flexural modulus | AA | C | A | B |
| | Electro-magnetic wave-shielding property | A | C | A | A |
| | Lightness | B | A | A | B |
| Presence of the line of junction on design surface side | | Yes | No | No | No |

The laminate and the integrally molded article of the present invention are preferable for use in the interior and exterior of automobiles, casing of electric and electronic equipment, bicycles, structural material of sport equipment, interior of aircraft, packing box, and the like.

EXPLANATION OF NUMERALS

1 radio wave permeable member
1a projection of radio wave permeable member
2 heat conducting member
3 rigidity retaining member
4 low density member
5 test specimen
6 apparatus for measuring electric field shielding property
7 signal transmitter antenna
8 thickness of the test specimen
9 signal receiver antenna
10 metal pipe
11 test piece
12 heat generating member
13 aluminum tape
14 insulating board
15a, 15b thermocouple

The invention claimed is:

1. A laminate comprising at least one radio wave permeable member having a radio wave permeability; at least one rigidity retaining member having an electromagnetic wave shielding property in the thickness direction of the radio wave permeable member; and at least one heat conducting member having an electromagnetic wave shielding property in the thickness direction of the radio wave permeable member; wherein at least one radio wave permeable member is arranged on the entire outermost surface on one side of the laminate; wherein the laminate has a radio wave permeable area solely constituted from the radio wave permeable member as a part of the laminate, and the radio wave permeable area is a thin area; wherein the radio wave permeable area has an antenna and wherein the antenna is on the inner surface on the radio wave permeable member; wherein the laminate has a heat conducting area wherein the heat conducting member is exposed; and wherein the heat conducting area is a thin area.

2. A laminate according to claim 1 wherein the members constituting the laminate are disposed symmetrically in the thickness direction in an area other than the radio wave permeable area and the heat conducting area, and the heat conducting member is disposed at the center in the thickness direction.

3. A laminate according to claim 1 wherein the radio wave permeable member has an electric field shielding property measured by KEC method of at least 0 dB and less than 20 dB in the frequency band of 1 GHz.

4. A laminate according to claim 1 wherein the rigidity retaining member and the heat conducting member have an electric field shielding property measured by KEC method of at least 20 dB and up to 80 dB in the frequency band of 1 GHz.

5. A laminate according to claim 1 wherein the heat conducting member has a thermal conductivity of at least 10 W/mK and up to 3000 W/mK.

6. A laminate according to claim 1 wherein the rigidity retaining member has a flexural modulus higher than that of the radio wave permeable member.

7. A laminate according to claim 1 wherein the rigidity retaining member is formed from a fiber-reinforced plastic containing conductive fibers.

8. A laminate according to claim 7 wherein the conductive fiber contains a carbon fiber.

9. A laminate according to claim 8 wherein the carbon fiber is a continuous carbon fiber.

10. A laminate according to claim 8 wherein the fiber-reinforced plastic forming the rigidity retaining member has a carbon fiber content by weight of at least 15% by weight to up to 80% by weight.

11. A laminate according to claim 1 wherein the radio wave permeable member comprises a fiber-reinforced plastic containing at least one non-conductive fiber selected from organic fibers and ceramic fibers.

12. An integrally molded article prepared by integrally molding the laminate according to claim 1 with one or more different members.

13. An integrally molded article according to claim 12 wherein the integration of the different member is conducted by injection molding.

* * * * *